(12) United States Patent
Lee

(10) Patent No.: US 11,069,302 B2
(45) Date of Patent: Jul. 20, 2021

(54) DISPLAY APPARATUS HAVING EXTENDED CONNECTING LINES

(71) Applicant: SAMSUNG DISPLAY CO., LTD., Yongin-si (KR)

(72) Inventor: Gichang Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/726,500

(22) Filed: Dec. 24, 2019

(65) Prior Publication Data

US 2020/0388230 A1 Dec. 10, 2020

(30) Foreign Application Priority Data

Jun. 5, 2019 (KR) ........................ 10-2019-0066878

(51) Int. Cl.
  *G09G 3/3275* (2016.01)
  *G09G 3/3266* (2016.01)

(52) U.S. Cl.
  CPC ......... *G09G 3/3275* (2013.01); *G09G 3/3266* (2013.01)

(58) Field of Classification Search
  CPC .................................................. G09G 3/3275
  See application file for complete search history.

(56) References Cited

U.S. PATENT DOCUMENTS

| | | | |
|---|---|---|---|
| 8,797,491 B2 | 8/2014 | Kim et al. | |
| 9,280,947 B2 | 3/2016 | Kim et al. | |
| 9,887,256 B2 | 2/2018 | Kim et al. | |
| 10,050,097 B2 | 8/2018 | Oh et al. | |
| 10,163,941 B1 | 12/2018 | Lee et al. | |
| 10,181,576 B2 | 1/2019 | Chung et al. | |
| 10,431,604 B2 | 10/2019 | Cho et al. | |
| 2017/0288002 A1* | 10/2017 | Kim | .................... H01L 51/0097 |
| 2018/0074361 A1 | 3/2018 | Chung et al. | |

FOREIGN PATENT DOCUMENTS

| | | |
|---|---|---|
| EP | 3 401 896 | 11/2018 |
| EP | 3 416 194 | 12/2018 |
| KR | 10-2014-0012271 | 2/2014 |
| KR | 10-1627245 | 6/2016 |
| KR | 10-2017-0049705 | 5/2017 |
| KR | 10-2017-0114028 | 10/2017 |
| KR | 10-2018-0030276 | 3/2018 |
| KR | 10-2018-0030325 | 3/2018 |

\* cited by examiner

*Primary Examiner* — Gustavo Polo

(74) *Attorney, Agent, or Firm* — F. Chau & Associates, LLC

(57) ABSTRACT

A display apparatus includes a substrate including a display area and a peripheral area at least partially surrounding the display area. A corner of an edge of the display area is curved. The peripheral area includes a pad area. A data line is disposed in the display area. A first connecting line is disposed in the display area and is connected to the data line to transmit a signal from the pad area to the data line. The first connecting line includes a first portion extending tram the edge in a direction away from the peripheral area and a second portion bent with respect to the first portion and extending towards the corner.

20 Claims, 34 Drawing Sheets

DISPLAY APPARATUS HAVING EXTENDED CONNECTING LINES

CROSS-REFERENCE TO RELATED APPLICATION

This application claims the benefit of and priority to Korean Patent Application No. 10-2019-0066878, filed on Jun. 5, 2019, in the Korean Intellectual Property Office, the disclosure of which is incorporated by reference herein in its entirety.

TECHNICAL FIELD

The present disclosure relates to a display apparatus and, more specifically, to a display apparatus having extended connecting lines.

DISCUSSION OF THE RELATED ART

Display apparatuses have evolved so as to be thin, relatively light weight, and to consume less power. Additionally, display apparatuses have begun to feature a larger viewing area with less surrounding space in which no image is displayed. As this surrounding space has decreased, physical button, etc. are removed from the front surface of the display apparatus.

SUMMARY

According to one or more embodiments of the present disclosure, a display apparatus includes a substrate including a display area and a peripheral area outside of the display area. A corner of an edge of the display area includes a round shape, and the peripheral area includes a pad area. A data line is arranged in the display area. A first connecting line is arranged in the display area and connects to the data line to transmit a signal from the pad area to the data line. The display area includes a dummy area adjacent to a boundary with the peripheral area. The first connecting line includes a first portion extending from the edge in a direction away from the peripheral area and a second portion bent from the first portion and extending towards the corner. The second portion is connected to the data line in the dummy area located at the corner.

In the first connecting line, the first portion and the second portion may extend in a direction inclined with respect to a first direction in which the data line extends by a certain angle.

The first portion and the second portion of the first connecting line may extend in a zigzag shape.

The first portion and the second portion of the first connecting line may extend linearly.

The data line and the first connecting line may be on different layers from each other.

The first connecting line may further include a third portion extending in a first direction in which the data line extends and/or a fourth portion extending in a second direction perpendicular to the first direction.

The display apparatus may further include a second connecting line arranged in the peripheral area and including one end connected to the first portion of the first connecting line and another end located in the pad area.

According to one or more embodiments of the present disclosure, a display apparatus includes a substrate including a display area and a peripheral area outside of the display area. A corner of an edge of the display area includes a round shape. The peripheral area includes a pad area. A plurality of scan lines is arranged in the display area and each of the scan lines extends in a first direction, A plurality of first data lines is arranged in the display area and each of the first data lines extends in a second direction perpendicular to the first direction. A plurality of first connecting lines is arranged in the display area and is connected to the plurality of first data lines so as to transmit a signal from the pad area to the plurality of first data lines. Each of the plurality of first connecting lines includes first portion extending from the edge in a direction away from the peripheral area and a second portion bent from the first portion and extending towards the corner. Each of the first portion and the second portion alternates between a first sub-portion extending parallel to at least one of the plurality of scan lines and a second sub-portion extending parallel to at least one of the plurality of first data lines.

In each of the plurality of first connecting lines, the first portion and the second portion may extend in a direction inclined with respect to the first direction by a certain angle while alternating between the first sub-portion and the second sub-portion.

The plurality of first connecting lines may be on a different layer from the plurality of scan lines.

The first sub-portion may at least partially overlap the at least one scan line.

The plurality of first connecting lines may be on a different layer from the plurality of first data lines.

The second sub-portion may at least partially overlap the at least one first data line.

The first sub-portion may include a length that is ii times (where n is a positive integer) as much as a first length corresponding to a distance between two adjacent first data lines, and the second sub-portion may include a length that is m times (where m is a positive integer) as much as a second length corresponding to a distance between two adjacent scan lines.

The first sub-portions of adjacent first connecting lines may be spaced apart from each other by a length that is n times (where n is a positive integer) as much as a second length corresponding to a distance between two adjacent scan lines, and the second sub-portions of the adjacent first connecting lines may be spaced apart from each other by a length that is m times (where in is a positive integer) as much as a first length corresponding to a distance between two adjacent first data lines.

Each of the plurality of first connecting lines may further include a third portion connected to the first portion and extending linearly in the first direction and a fourth portion connected to the second portion and extending linearly in the first direction.

Each of the plurality of first connecting lines may further include a fifth portion located between the first portion and the second portion and extending linearly in the first direction.

The display area may include a dummy area adjacent to a boundary with the peripheral area. The second portion may be connected to one of the plurality of first data lines in the dummy area located at the corner.

The display apparatus may further include a second connecting line arranged in the peripheral area and including one end connected to the first portion of each of the plurality of first connecting lines and the other end located in the pad area.

The display apparatus may further include a plurality of second data lines arranged in the display area and each of which extending in the second direction. A third connecting line may be arranged in the peripheral area and may include one end connected to one of the plurality of second data lines and another end located in the pad area.

BRIEF DESCRIPTION OF THE DRAWINGS

A more complete appreciation of the present disclosure and many of the attendant aspects thereof will be more apparent from the following description taken in conjunction with the accompanying drawings, in which.

DETAILED DESCRIPTION

Figure 1:
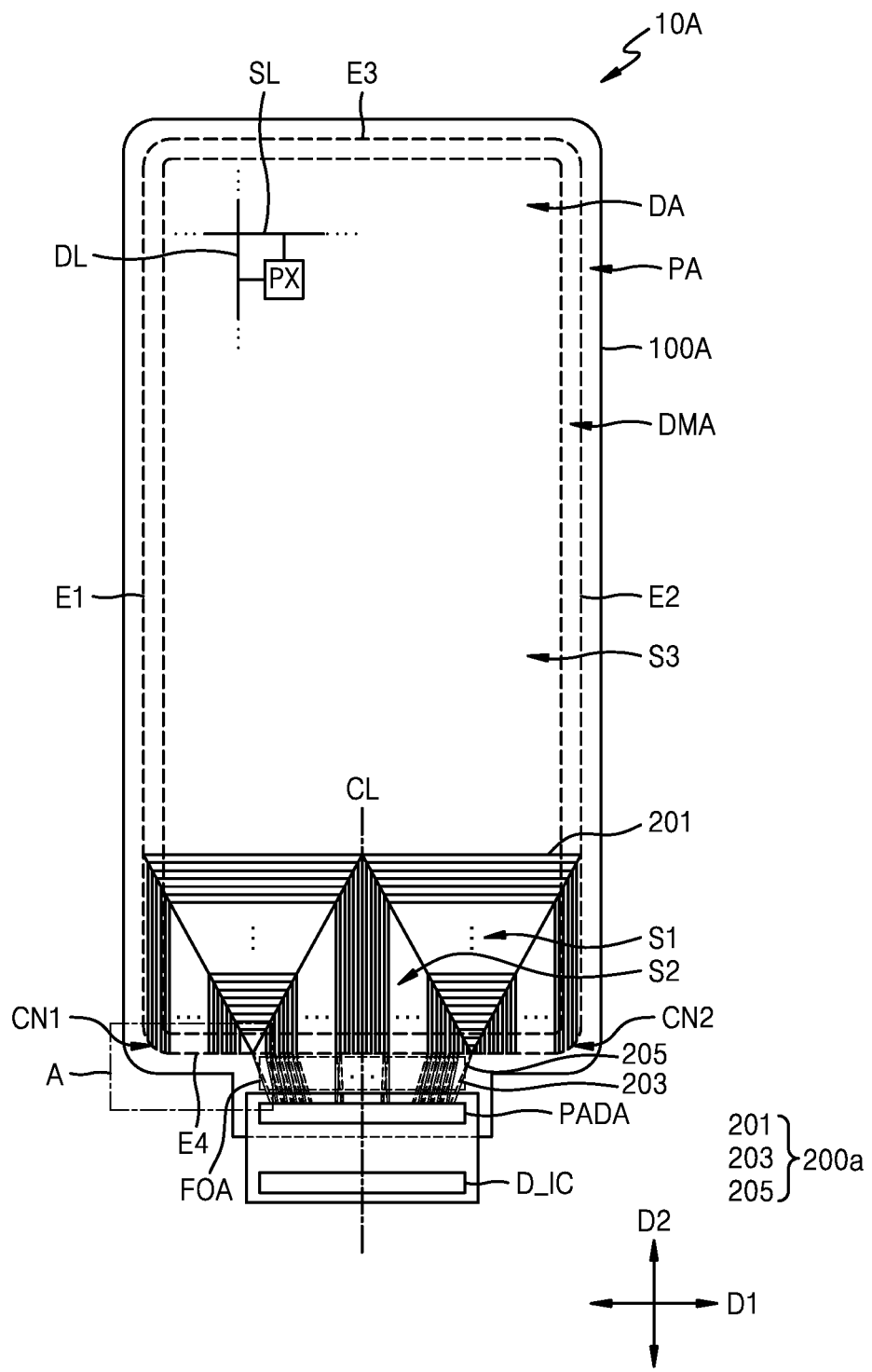
FIG. 1 is a plan view schematically illustrating an example of a display panel according to an exemplary embodiment of the present disclosure.

Reference will now be made in detail to embodiments, examples of which are illustrated in the accompanying drawings, wherein like reference numerals may refer to like elements throughout the drawings and disclosure.

Such terms as "first" and "second" are not used for limitation of meaning but are used to distinguish one element from another.

The singular forms "a", "an", and "the" used herein are intended to include the plural forms as well, unless the context clearly indicates otherwise.

It will be understood that the terms "comprise", "comprising", 'include', and/or "including", when used herein, specify the presence of stated features or elements, but do not preclude the presence or addition of one or more other features or elements.

In contrast, the term "consisting of", when used herein, specify the presence of stated features or elements and preclude the presence of additional features or elements.

It will be further understood that, when a layer, region, or element is referred to as being "on" another layer, region, or element, it can be directly or indirectly on the other layer, region, or element. For example, for example, intervening layers, regions, or elements may be present.

Sizes of elements in the drawings may be exaggerated or reduced for convenience of explanation. Thus, while the relative sizes and angles of the elements shown in the drawings may be indicative of at least one exemplary embodiment of the present disclosure, there may be other exemplary embodiments of the present disclosure that have relative sizes and angles that are different from what is being shown.

When a wire is referred to as 'extending in a first direction or a second direction', the wire not only may extend in a linear shape but may extend in a zigzag or curved shape in the first direction or the second direction. Moreover, when it is said that a wire or element extends in a particular direction, this means that the wire or element extends primarily in that particular direction, e.g. that the wire or element extends in the particular direction to a greater extent than any other directions.

The phrase "in plan view" refers to a view of a target portion seen from above, and the phrase "in cross-sectional view" refers to a vertically cross-sectional view of a target portion seen from the side. The term "overlap" includes overlapping "in plan view" and "in cross-sectional view" unless otherwise qualified.

Unless otherwise defined, a signal described herein is a generic term for voltage or current.

Hereinafter, embodiments will be described in detail with reference to the accompanying drawings, wherein like reference numerals may refer to like elements throughout the drawings and disclosure.

Figure 2:
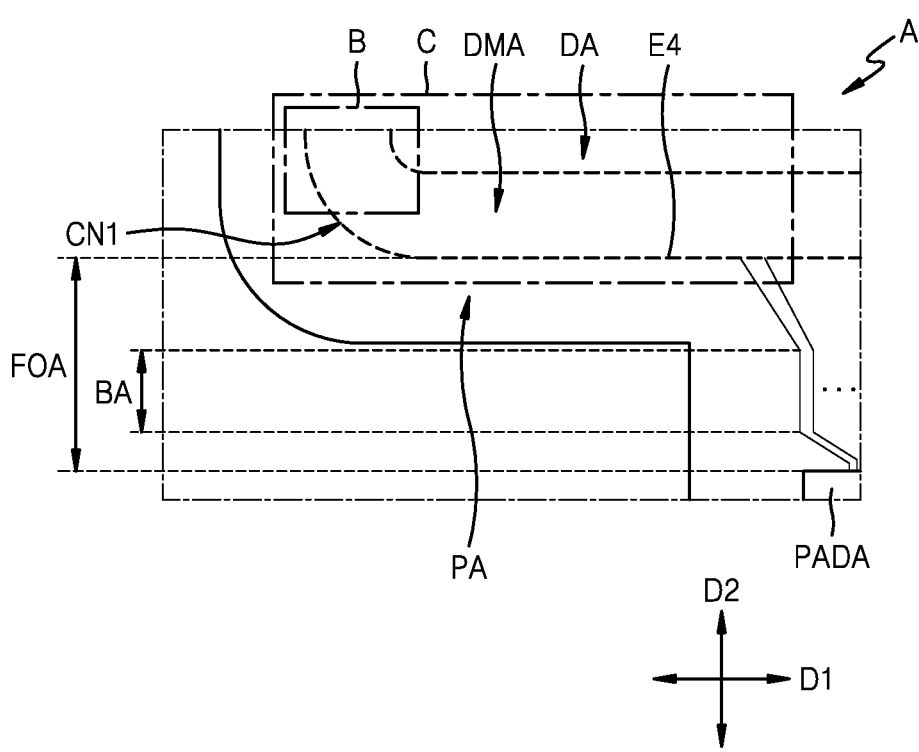
FIG. 2 is a conceptual diagram schematically illustrating region A of FIG. 1.
Figure 3:
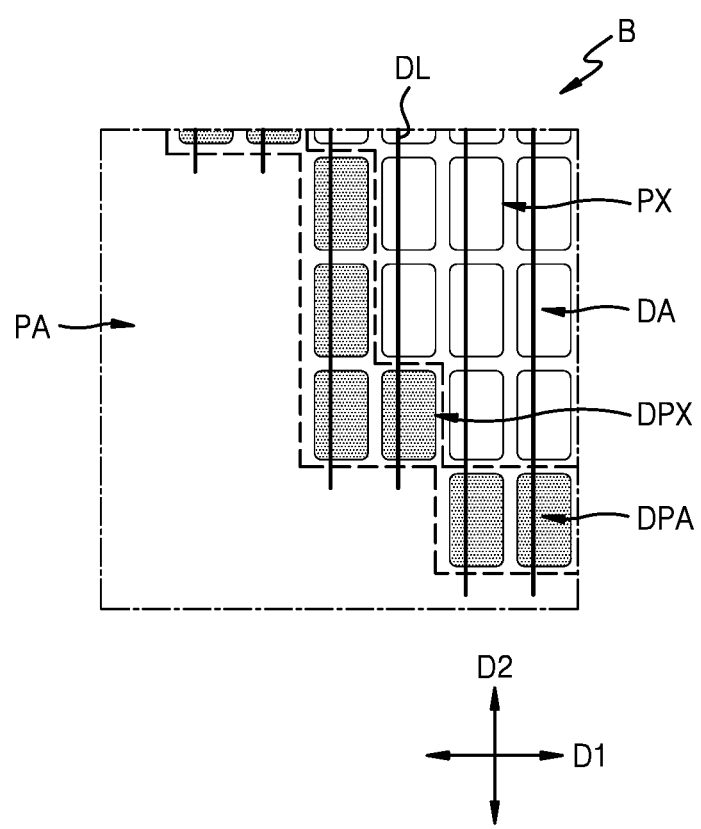
FIG. 3 is a conceptual diagram schematically illustrating region B of FIG. 2.
Figure 4:
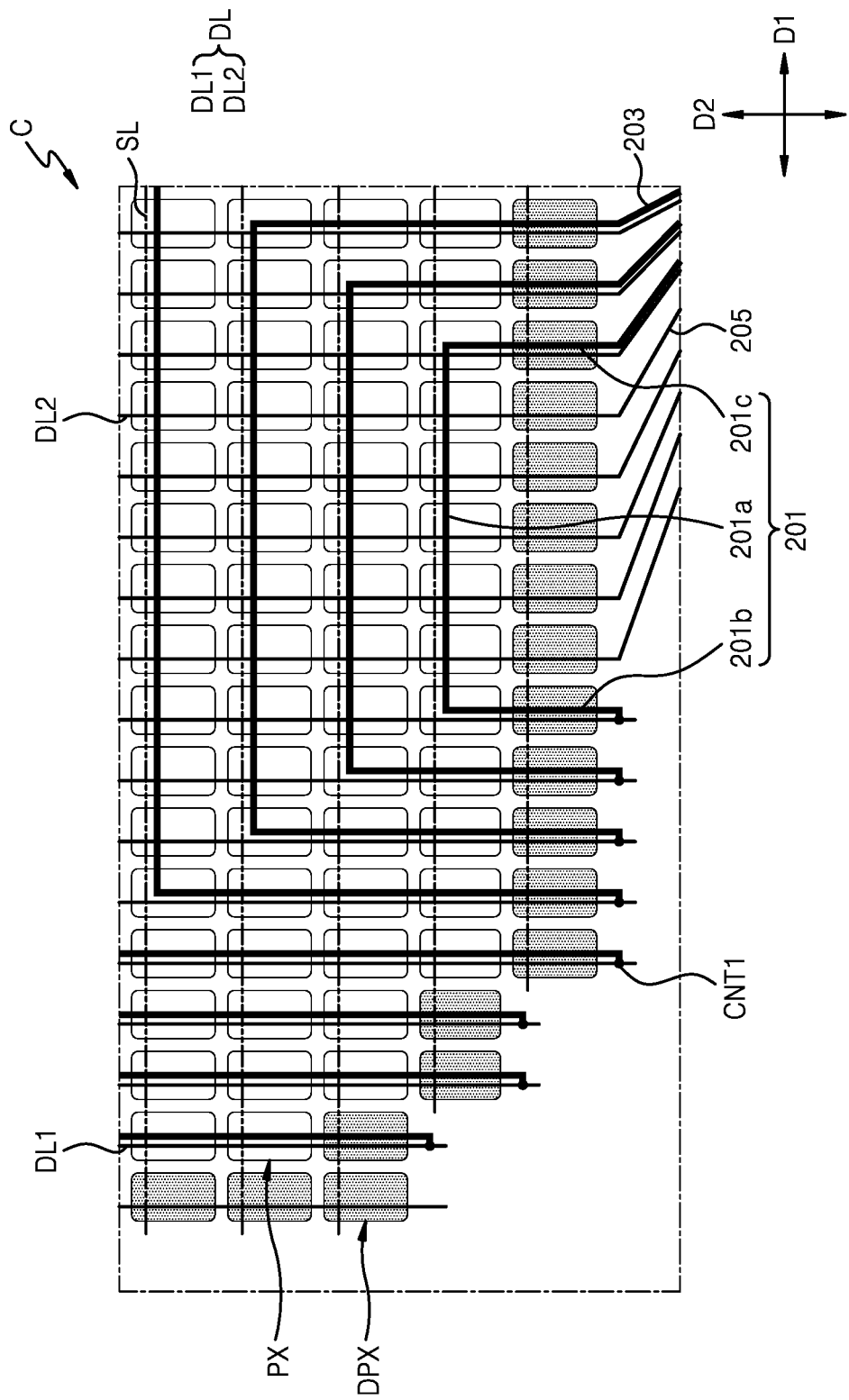
FIG. 4 is a conceptual diagram schematically illustrating region C of FIG. 2.
Figure 5:
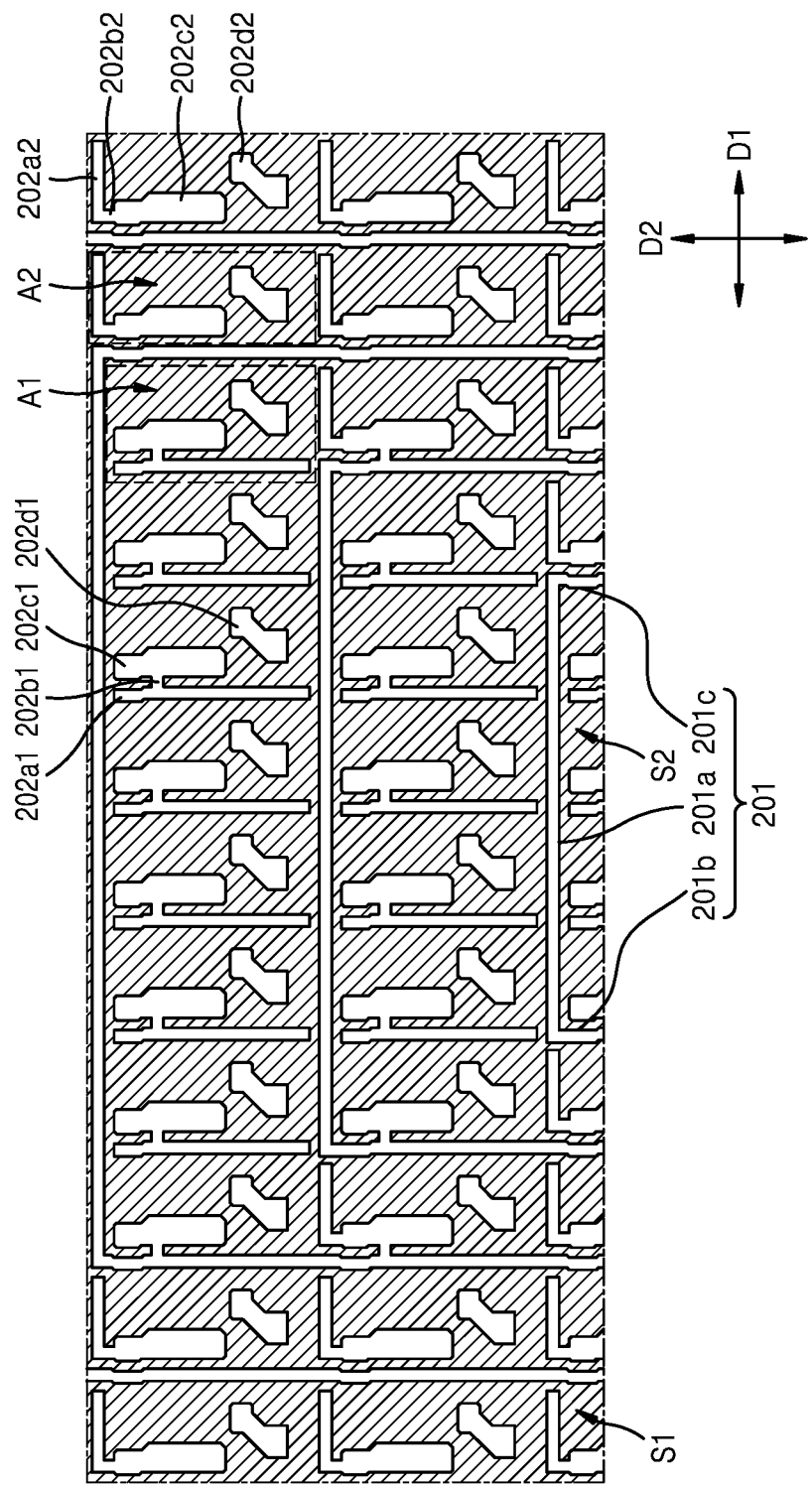
FIG. 5 is a plan view partially enlarging region C of FIG. 2.

FIG. 1 is a plan view schematically illustrating an example of a display panel 10A according to an exemplary embodiment of the present disclosure. FIG. 2 is a conceptual diagram schematically illustrating region A of FIG. 1, and FIG. 3 is a conceptual diagram schematically illustrating region B of FIG. 2. FIG. 4 is a conceptual diagram schematically illustrating region C of FIG. 2, and FIG. 5 is a plan view partially enlarging region C of FIG. 2.

Referring to FIG. 1, the display panel 10A, according, to an exemplary embodiment of the present disclosure, has a display area DA for displaying an image and a peripheral area PA located outside of the display area DA. No image is displayed in the peripheral area PA. The peripheral area PA at least partially surrounds the display area. A single substrate 100A included in the display panel 10A may include both the display area DA and the peripheral area PA.

Edges of the display area DA may form right angles. As illustrated in FIGS. 1 and 2, a first corner CN1 of the edge of the display area DA may have a round shape. Specifically, the display area DA may include a first edge E1 and a second edge E2 facing each other and a third edge E3 and a fourth edge E4 located between the first edge E1 and the second edge E2 and facing each other. A pad area PADA is adjacent to the fourth edge E4 from among the first to fourth edges E1 to E4. In this regard, the first corner CN1 having a round shape, connects the first edge E1 to the fourth edge E4. In addition to the first corner CN1, a second corner CN2 at the edge of the display area DA may also have a round shape. The second corner CN2 connects the second edge E2 to the fourth edge E4. Not only the edge but also another portion of the display area DA may have a round shape.

A plurality of pixels PX and wires capable of applying electrical signals to the plurality of pixels PX may be located in the display area DA. The peripheral area. PA may be free of pixels PX.

Each of the plurality of pixels PX may include a display element and a circuit portion for driving the display element. For example, the display element may be an organic light-emitting diode, and the circuit portion may include a plurality of transistors, a capacitor, etc.

Signal lines capable of applying electrical signals to the plurality of pixels PX may include a plurality of scan lines SL, a plurality of data lines DL, etc. Each of the plurality of scan lines SL may extend in a first direction D1, and each of the plurality of data lines DL may extend in a second direction D2. The plurality of scan lines SL, for example, may be arranged in a plurality of rows to transmit scan signals to the pixels PX, and the plurality of data lines DL, for example, may be arranged in a plurality of columns to transmit data signals to the pixels PX. Each of the plurality of pixels PX may be connected to a corresponding scan line SL from among the plurality of scan lines SL and a corresponding data line DL from among the plurality of data lines DL.

The peripheral area PA may at least partially surround the display area DA. The peripheral area PA, which is an area having no pixels PX arranged therein, may include the pad area PADA, which is an area to which various electronic devices or a printed circuit board, etc. are electrically attached. A voltage line, etc. supplies power for driving the display element and may be located in the peripheral area PA. A plurality of pads of the pad area PADA may be electrically connected to a film on which a data driver DL1 is arranged. FIG. 1 illustrates a chip on film (COF) method in which the data driver D_IC is arranged on the film electrically connected to pads arranged on the substrate 100A. According to an exemplary embodiment of the present disclosure, the data driver D_IC may be directly arranged on the substrate 100A by a chip on glass (COG) method or a chip on plastic (COP) method.

As illustrated in FIG. 2, the peripheral area PA may include a bending area BA, and the bending area BA may be located between the pad area PADA and the display area DA. In this case, a substrate may be bent in the bending area BA to allow at least a portion of the pad area PADA to overlap the display area DA. However, the pad area PADA does not cover the display area DA, and a bending direction is set to allow the pad area PADA to be located behind the display area DA. Accordingly, a user views the display area DA as occupying the majority of the display panel WA, FIG. 3 is a conceptual diagram schematically illustrating region B of FIG. 2 and shows a portion of the first corner CN1. As illustrated in FIGS. 1 and 2, when a user using a display apparatus according to the present embodiment or an electronic apparatus including the display apparatus observes the first corner CN1 in a usual use environment, the first corner CN1 is recognized as having a round: curved shape. However, in an environment in which wires having widths of a few micrometers or tens of micrometers are able to be observed by enlarging the first corner CN1, as illustrated in FIG. 3, the first corner CN1 may be shown as having a linear shape bent a plurality of times in the first direction D1 and the second direction D2, Although the first corner CN1 is shown as having a linear shape bent a plurality of times as illustrated in FIG. 3 by enlarging the first corner CN1, the first corner CN1 is recognized as having a round/curved shape, in the usual use environment, and thus, the first corner CN1 is described below as having a round shape.

The display area DA may include a dummy area DMA. The dummy area DMA may be provided along the first to fourth edges E1 to E4 and the first and second corners CN1 and CN2 of the display area DA and may be adjacent to a boundary between the display area DA and the peripheral area PA. A plurality of dummy pixels DPX may be arranged in the dummy area DMA. The dummy pixels DPX may surround the pixels PX and may be located around outermost pixels PX. In the dummy area DMA, one or more dummy pixels DPX may be arranged on opposite ends of each pixel column and/or opposite ends of each pixel row. The number of dummy pixels DPX arranged in each pixel column or each pixel row may be identical or different. FIG. 3 illustrates some of the plurality of pixels PX and some of the plurality of dummy pixels DPX in the display area DA for convenience. Although the display area DA is described herein as including the dummy area DMA, the dummy area DMA may be a boundary area between the display area DA and the peripheral area PA.

Connecting lines 200a for transmitting electrical signals supplied from pads to signal lines connected to the pixels PX may be provided on the substrate 100A. For example, signal lines may be the data lines DL, and the connecting lines 200a may be arranged between the data lines DL and the pad area. PADA to transmit data signals supplied from pads of the pad area PADA to the data lines DL.

The connecting lines 200a may include first connecting lines 201, second connecting lines 203, and third connecting lines 205. The first connecting lines 201 may be arranged in the display area DA. The second connecting lines 203 and the third connecting lines 205 may be arranged in the peripheral area PA. Some of the first connecting lines 201 may be arranged in the dummy area DMA. The second connecting lines 203 and the third connecting lines 205 may be arranged in a fan-out area FOA located in the peripheral area PA. The fan-out area FOA may be located between the pad area PADA and the display area DA.

The display area DA may be divided into a plurality of areas according to an extension direction of the First connecting lines 201. For example, the display area DA may include a first area S1 in which the first connecting lines 201 extend in the first direction D1, a second area S2 in which the first connecting lines 201 extend in the second direction D2, and a third area S3, which is the remaining area excluding the first area S1 and the second area S2. The third area S3 may be an area having no first connecting lines 201 arranged therein. The first area S1 and the second area S2 may each be plural and may each have a triangular shape. For example, the second area S2 located at the center may be triangular. First areas S1 on both sides of the second area S2 located at the center may each be in the shape of an inverted-triangle. Second areas S2 located outside the first areas S1 may have a right triangle shape.

The first connecting lines 201 arranged on the left side of a central line CL passing through a center of the display panel 10A in the first direction D1 and the first connecting lines 201 arranged on the right side of the central line CL may be substantially and vertically symmetric about the central line CL.

Referring to FIG. 4, the first connecting lines 201 may be located on different layers from the scan lines SL and the data lines DL of the pixel PX. Each of the first connecting lines 201 may include a first portion 201a extending in the first direction D1 and a second portion 201b and a third portion 201c respectively extending from opposite ends of the first portion 201a in the second direction D2. The first portion 201a may connect the second portion 201b to the third portion 201c, and the first to third portions 201a to 201c may be integrally formed (formed as one continuous body). The first portion 201a of each of the first connecting lines 201 may extend parallel to the scan line SL of the pixel PX and may partially overlap or be otherwise adjacent to the scan line SL. The first portion 201a of each of the first connecting lines 201 may extend parallel to the scan line SL arranged in one of a plurality of rows. The second portion 201b and the third portion 201c of each of the first connecting lines 201 may extend parallel to the data line DL and may partially overlap or be otherwise adjacent to the data line DL. The second portion 201b of each of the first connecting lines 201 may extend parallel to a first data line DL1 arranged in one of a plurality of columns. The third portion 201c of each of the first connect ng lines 201 may extend parallel to a second data line DL2 arranged in one column from among columns excluding the column in which the second portion 201b is arranged from among a plurality of columns.

One end of the first connecting line 201 may be connected to the first data line DL1, and the other end thereof may be connected to the second connecting line 203. For example, the second portion 201b of the first connecting line 201 may be connected to the first data line DL1 in a first contact portion CNT1 located in the dummy area DMA. The third portion 201c of the first connecting line 201 may be connected to the second connecting line 203. According to an exemplary embodiment of the present disclosure, the second connecting line 203 may be a portion where the third portion 201c of the first connecting line 201 extends to the peripheral area PA via the dummy area DMA. One end of the second connecting line 203 may be connected to the other end of the first connecting line 201, and the other end of the second connecting line 203 may be connected to a pad of the pad area PADA. One end of the third connecting line 205 may be connected to the second data line DL2, and the other end of the third connecting line 205 may be connected to a pad of the pad area. PADA. One end of the third connecting line 205 may be connected to the second data line DL2 in the dummy area DMA. The third connecting line 205 may be a portion where the second data line DL2 that is not connected to the first connecting line 201 extends to the peripheral area PA via the dummy area DMA.

As illustrated in FIG. 5, first pattern areas A1 defined between first portions 201a of adjacent first connecting, lines 201 may be located in the first area S1. A first dummy pattern 202a1, a second dummy pattern 202c1 and a third dummy pattern 202d1 may be arranged in the first pattern area A1. The first dummy pattern 202a1 may be located on an imaginary straight line extending from the second portion 201b or the third portion 201c of the first connecting line 201. The first dummy pattern 202a1 and the second dummy pattern 202c1 may be connected to each other by a branch 202b1 protruding from the first dummy pattern 202a1. The branch 202b1, which is a portion of the first dummy pattern 202a1, may be a dummy pattern. The first dummy pattern 202a1, the branch 202b1, and the second dummy pattern 202c1 may be integrally formed.

Likewise, second pattern areas A2 defined between second portions 201b or third portions 201c of the adjacent first connecting lines 201 may be located in the second area S2. A first dummy pattern 202a2, a second dummy pattern 202c2, and a third dummy pattern 202d2 may be arranged in the second pattern area A2. The first dummy pattern 202a2 may be located on an imaginary straight line extending from the first portion 201a of the first connecting line 201. The first dummy pattern 202a2 and the second dummy pattern 202c2 may be connected to each other by a branch 202b2 protruding from the first dummy pattern 202a2 in the second direction D2, The branch 202b2, which is a portion of the first dummy pattern 202a2, may be a dummy pattern. The first dummy pattern 202a2, the branch 202b2, and the second dummy pattern 202c2 may be integrally formed.

The first connecting line 201, the first dummy pattern 202a1, the second dummy pattern 202c1, the third dummy pattern 202d1, and the branch 202b1 of the first pattern area A1, the first dummy pattern 202a2, the second dummy pattern 202c2 the third dummy pattern 202d2, and the branch 20212 of the second pattern area A2 may be arranged on the same layer. The second dummy pattern 202c1 and the third dummy pattern 202d1 of the first pattern area A1 and the second dummy pattern 202c2 and the third dummy pattern 202d2 of the second pattern area A2 may have similar shapes to each other.

Since reflection characteristics of light become similar in the first area S1 and the second area S2, due to the first pattern areas A1 and the second pattern areas A2, it may be difficult to recognize a division between the first area S1 and the second area S2 according to an incidence angle of light.

Figure 6A:
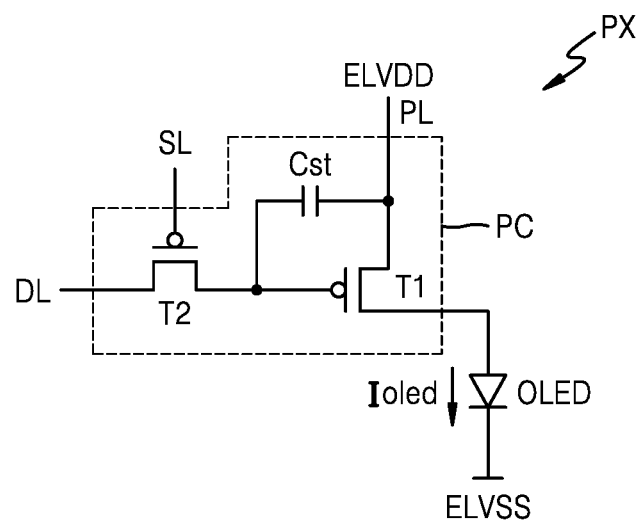
FIGS. 6A and 6B are equivalent circuit diagrams illustrating one pixel arranged in a display panel according to an exemplary embodiment of the present disclosure.
Figure 6B:
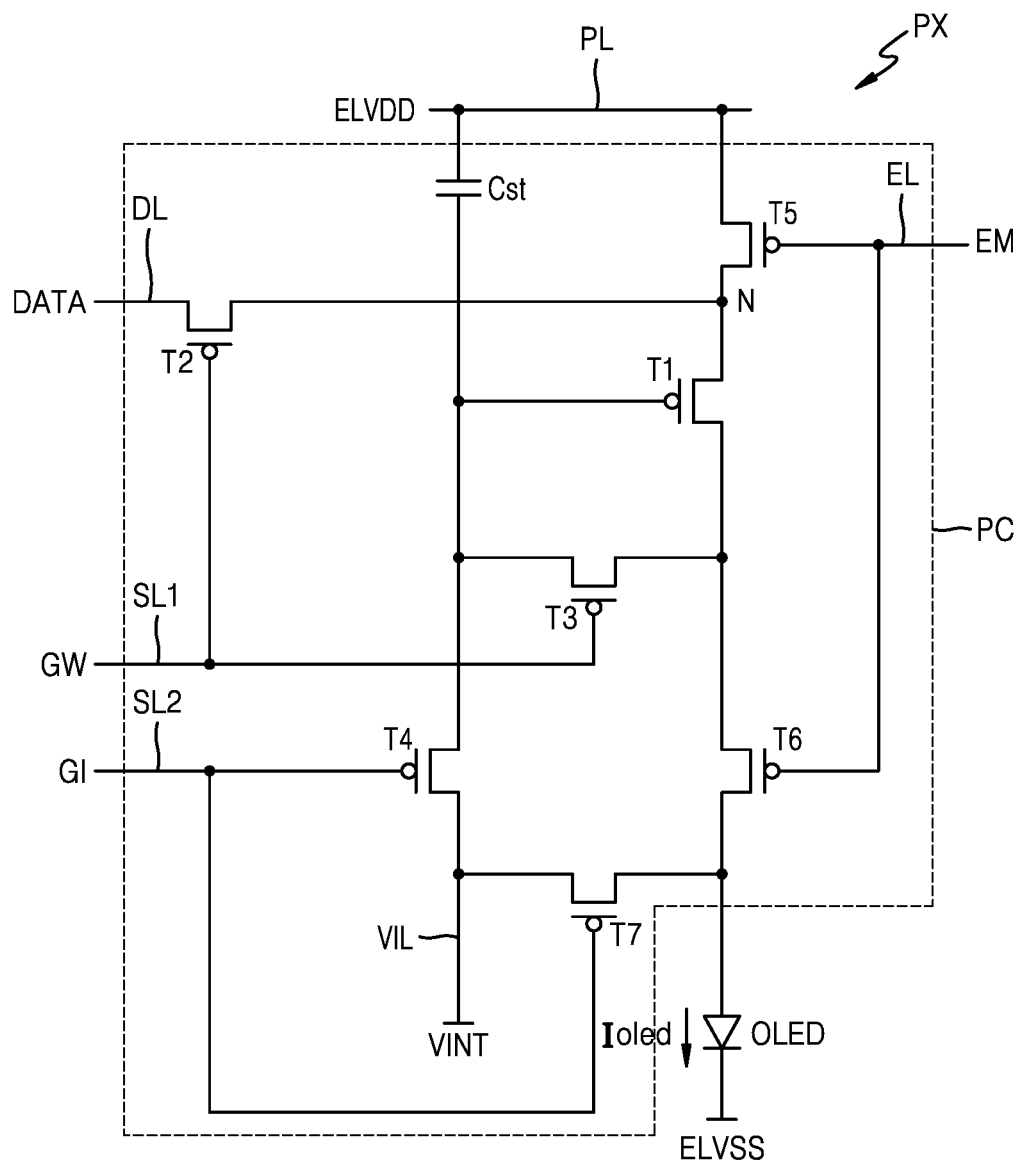

FIGS. 6A and 6B are equivalent circuit diagrams illustrating one pixel PX arranged in a display panel according to an exemplary embodiment of the present disclosure.

Referring to FIG. 6A, the pixel PX includes a pixel circuit PC and an organic light-emitting diode OLED, which is a display device connected to the pixel circuit PC. The pixel circuit PC may include a first transistor T1, a second transistor T2, and a capacitor Cst. Each pixel PX may emit, for example, red, green, blue, or white light, from the organic light-emitting diode OLED. The first transistor T1 and the second transistor 12 may be thin film transistors.

The second transistor 12, which is a switching transistor, may be connected to the scan liars SL and the data line DL and may transmit a data signal input from the data line DL to the first transistor T1 according to a switching voltage input to the scan line SL. The capacitor Cst may be connected to the second transistor T2 and a power voltage line PL and may store a voltage corresponding to a difference between a voltage corresponding to the data signal received from the second transistor 12 and a first power voltage ELVDD, which is supplied to the power voltage line PL The power voltage line PL may be spaced apart from the scan line SL or the data line DL in parallel.

The first transistor which is a driving transistor, may be connected to the power voltage line PL and the capacitor Cst and may control a driving current Ioled flowing from the power voltage line PL through the organic light-emitting diode OLED in response to a voltage value stored in the capacitor Cst. The organic light-emitting diode OLED may emit light having a particular brightness according: to the driving current Ioled. An opposite electrode (for example, a cathode) of the organic light-emitting diode OLED may receive a second power voltage ELVSS.

Although FIG. 6A illustrates the pixel circuit PC including two transistors and one capacitor, embodiments are not limited thereto. The number of transistors and the number of capacitors may be variously changed according to design of the pixel circuit PC.

Although FIG. 6B illustrates signal lines SL1, SL2, EL, and DL, an initialization voltage line VIL, and the power voltage line PL provided for each pixel PX, embodiments are not limited thereto. According to an exemplary embodiment of the present disclosure, at least one of the signal lines SL1, SL2, EL, and DL, the initialization voltage line VIL and/or the power voltage line PL may be shared between neighboring pixels.

The signal lines include a first scan line SL1 transmitting a first scan signal GW, a second scan line SL2 transmitting a second scan signal G1, an emission control line EL transmitting an emission control signal EM, and the data line DL crossing the first scan line SL1 and transmitting a data signal DATA. The second scan line SL2 may be connected to the first scan line SL1 of the next row or the previous row, and the second scan signal GI may be the first scan signal GW of the next row or the previous row.

The power voltage line PL transmits the first power voltage ELVDD to the first transistor T1, and the initialization voltage line VIL transmits an initialization voltage VENT for initializing the first transistor T1 and a pixel electrode of organic light-emitting diode OLED to the pixel PX.

The first scan line SL1, the second scan line SL2, the emission control line EL, and the initialization voltage line VIL may extend in the first direction D1 and may be spaced apart from each other in respective rows. The data line DL and the power voltage line PL may extend in the second direction D2 and may be spaced apart from each other in respective columns. The first scan line SL1 or the second scan line SL2 may be the scan line SL illustrated in FIG. 4.

The pixel circuit PC of the pixel PX may include first to seventh transistors T1 to T7 and the capacitor Cst. The first to seventh transistors T1 to T7 may be thin film transistors.

The first transistor T1 is connected to the power voltage line PL via the fifth transistor T5 and is electrically connected to the pixel electrode of the organic light-emitting diode OLED via the sixth transistor T6. The first transistor T1 serves as a driving transistor, and as the data signal DATA is transmitted to the first transistor T1 according to a switching operation of the second transistor T2, the first transistor T1 supplies the driving current bled to the organic light-emitting diode OLED.

The second transistor T2 is connected to the first scan line SL1 and the data line DL, and as the second transistor T2 is turned on according to the first scan signal GW received through the first scan line SL1, the second transistor T2 performs a switching operation for transmitting the data signal DATA transmitted through the data line DL to a node N.

The third transistor T3 is connected to the pixel electrode of the organic light-emitting diode OLED via the sixth transistor 16. As the third transistor 13 is turned on according to the first scan signal GW received through the first scan line SL1, the third transistor T3 diode-connects the first transistor T1.

As the fourth transistor 14 is turned on according to the second scan signal GI received through the second scan line SL2, the fourth transistor T4 initializes a gate voltage of the first transistor T1 by transmitting the initialization voltage VINT input to the initialization voltage line VIL to a gate electrode of the first transistor T1.

As, the fifth transistor T5 and the sixth transistor T6 are simultaneously turned on according to the emission control signal EM received through the emission control line EL, a current path is formed to allow the driving current Idled to flow in a direction from the power voltage line PL to the organic light-emitting, diode OLED.

As the seventh transistor T7 is turned on according to the second scan signal received through the second scan line SL2, the seventh transistor T7 initializes the pixel electrode of the organic light-emitting diode OLED by transmitting the initialization voltage VINT input to the initialization voltage line VIL to the pixel electrode of the organic, light-emitting diode OLED. The seventh transistor T7 may be omitted.

Although FIG. 6B illustrates the fourth transistor T4 and the seventh transistor T7 connected to the second scan line SL2, exemplary embodiments of the present disclosure are not limited thereto. According to an exemplary embodiment of the present disclosure, the fourth transistor T4 may be connected to the second scan line SL2, and the seventh transistor T7 may be connected to a separate wire and be driven according to a signal transmitted to the wire.

The capacitor Cst may be connected to the power voltage line PL and the gate electrode of the first transistor T1 and may maintain a voltage that is applied to the gate electrode of the first transistor T1 by storing and maintaining a voltage corresponding to a difference between voltages at both ends.

The organic light-emitting diode OLED may include the pixel electrode, a common electrode facing the pixel electrode, and an emission layer between the pixel electrode and the common electrode. The second power voltage ELVSS may be applied to the common electrode. The organic light-emitting diode OLED receives the driving current toted from the first transistor T1 and thus emits light, thereby displaying an image.

The dummy pixel DPX may include the same pixel circuit PC as the pixel PX of FIGS. 6A and 6B and might not include some elements of the organic light-emitting diode OLED and thus may emit no light. According to an exemplary embodiment of the present disclosure, the dummy pixel DPX may include no pixel electrode but may include an emission layer and an opposite electrode.

Figure 7:
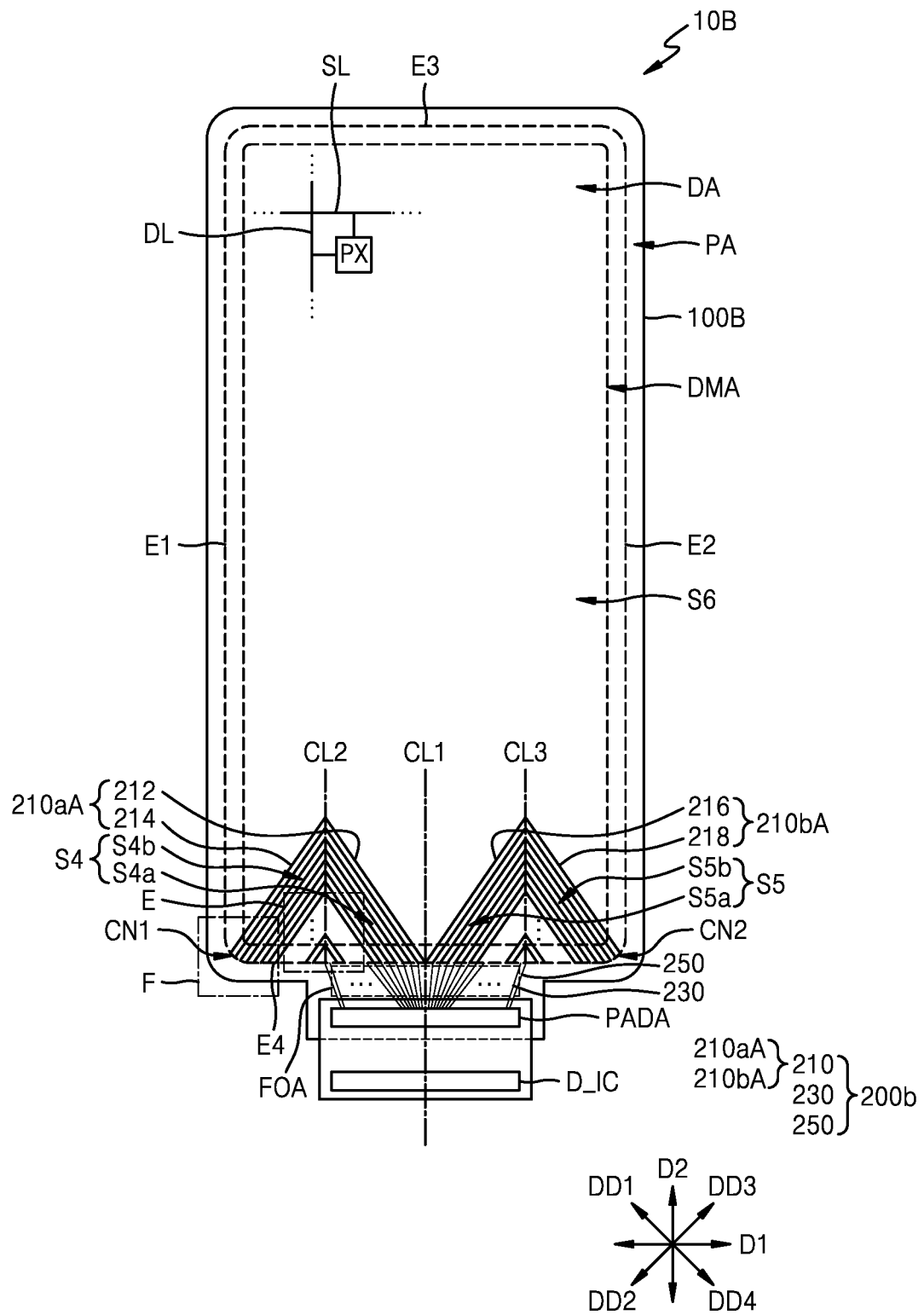
FIG. 7 is a plan view schematically illustrating an example of a display panel according to an exemplary embodiment of the present disclosure.
Figure 8:
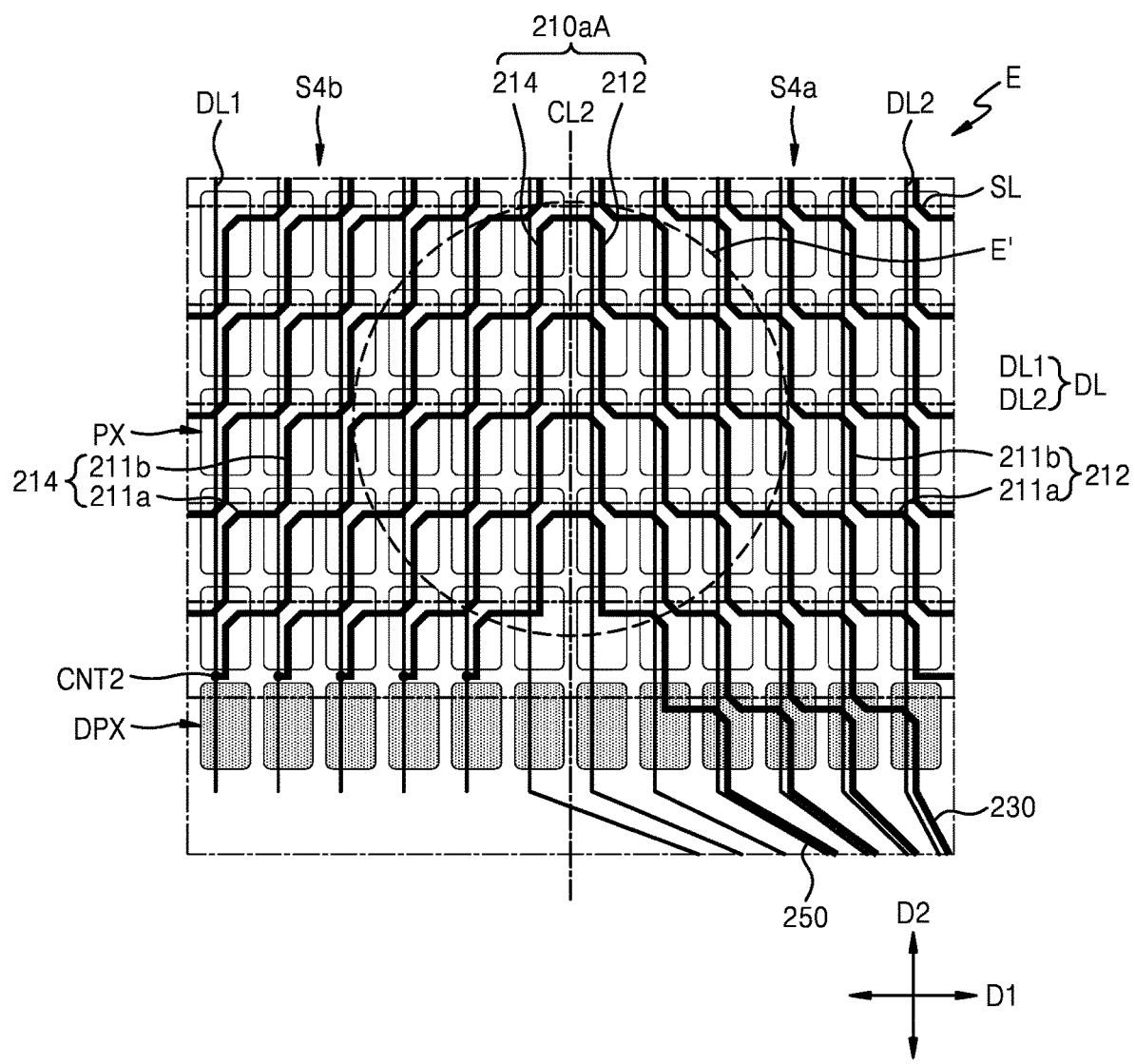
FIG. 8 is a plan view schematically illustrating an example of region E of FIG. 7.
Figure 9:
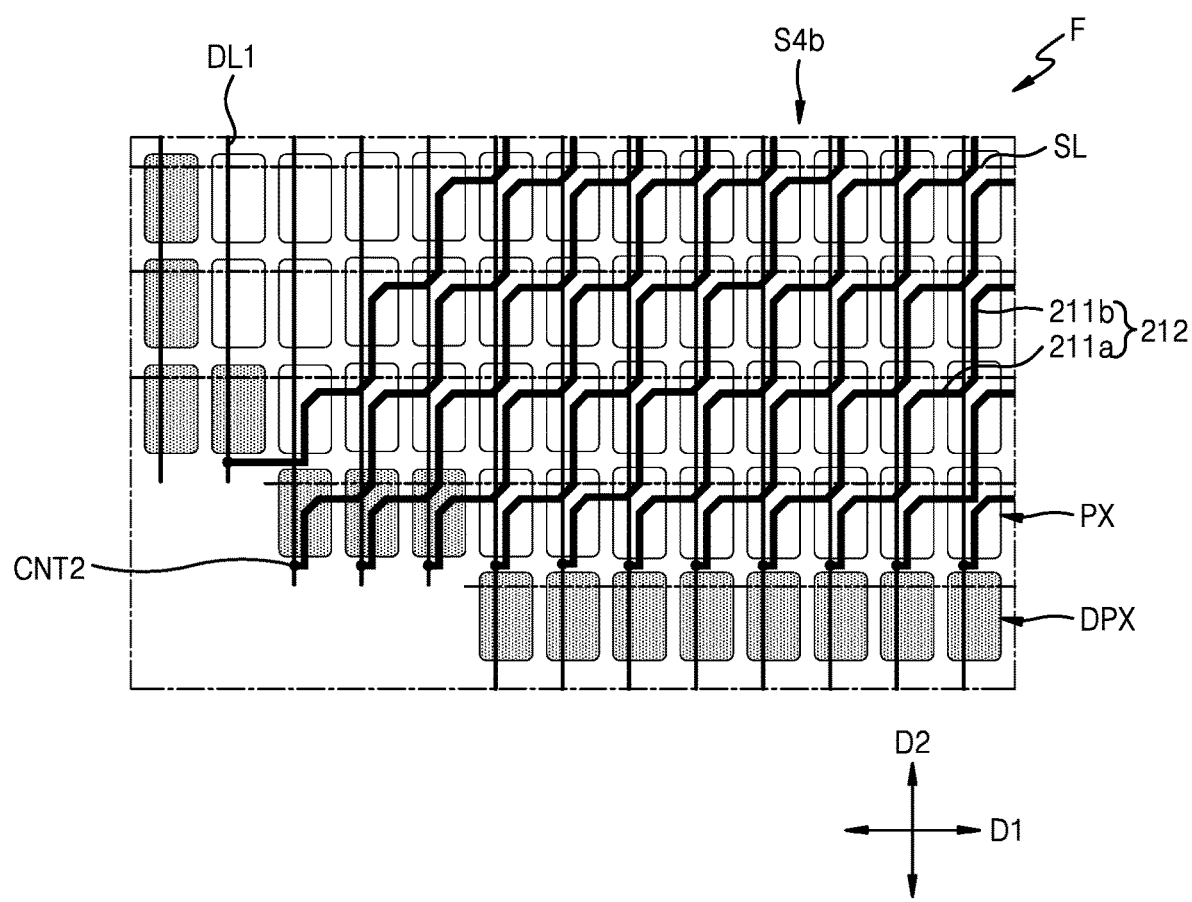
FIG. 9 is a plan view schematically illustrating an example of region F of FIG. 7.
Figure 10:
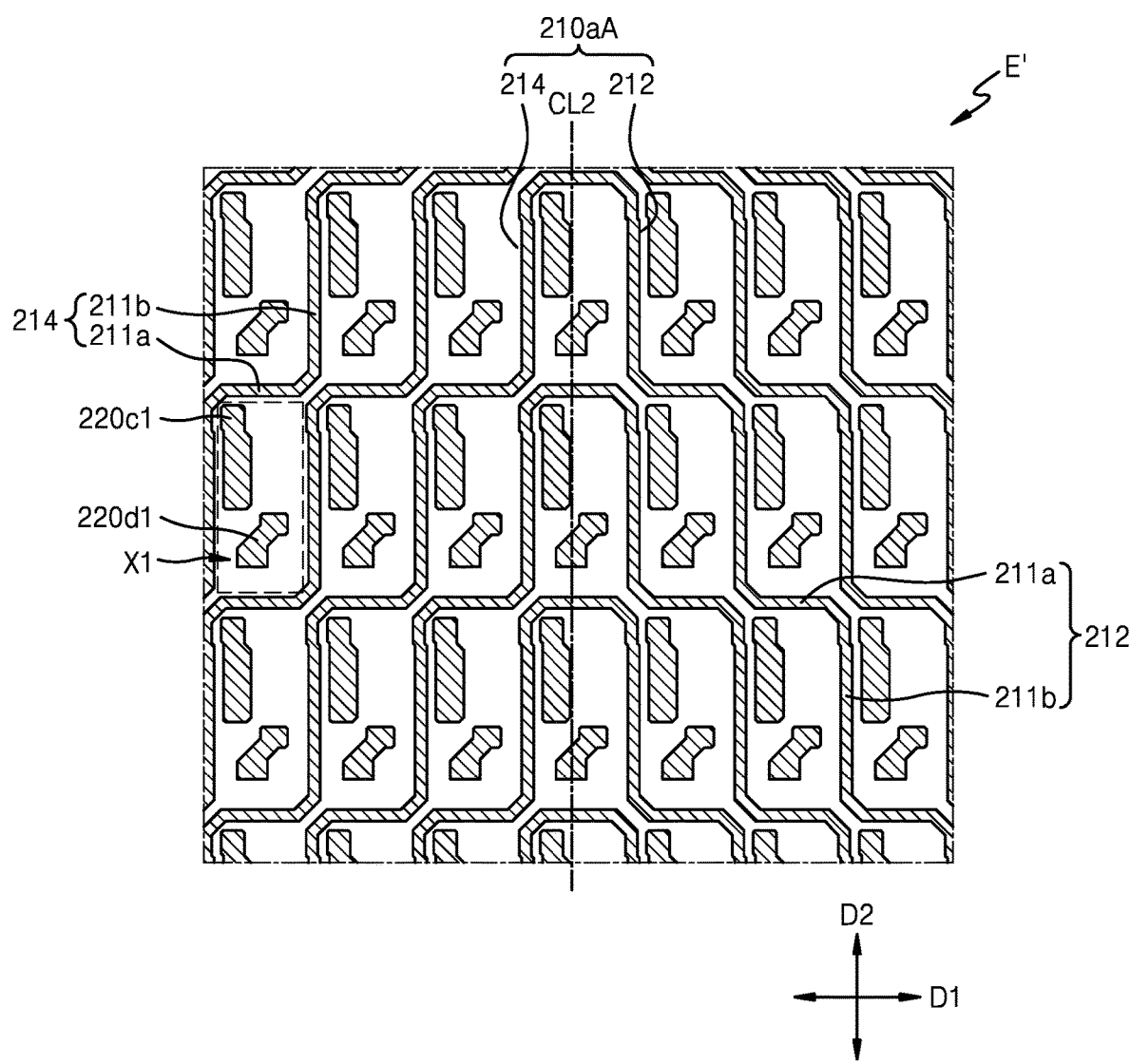
FIG. 10 is an enlarged plan view of region E' of FIG. 8.

FIG. 7 is a plan w schematically illustrating an example of a display panel 10B according to an exemplary embodiment of the present disclosure. FIGS. 8 and 9 are plan views schematically illustrating an, example of region F and region F of FIG. 7. FIG. 10 is an enlarged plan view of region E' of FIG. 8.

In the display panel 10B of FIG. 7, an arrangement of first connecting lines 210 is different from that of the first connecting lines 201 of the display panel 10A of FIG. 1, however, other details may be at least similar to what has already been described. Hereinafter, different configurations from FIG. 1 will be mainly described.

Referring to FIG. 7, the display panel 10B, according to an exemplary embodiment of the present disclosure, has the display area DA for displaying an image and the peripheral area PA located outside the display area DA. For example, a substrate 100B included in the display panel 10B may include both the display area DA and the peripheral area PA. The display area DA may include the dummy area DMA provided along the first to fourth edges E1 to E4 and the first and second corners CN1 and CN2.

The plurality of pixels PX and wires capable of applying electrical signals to the plurality of pixels PX may be located in the display area DA. The pixel PX may be a pixel illustrated in FIGS. 6A and 6B, The dummy pixels DPX may be arranged in the dummy area DMA surrounding the pixels PX and adjacent to the peripheral area PA.

Connecting lines 200b for transmitting electrical signals supplied from pads to signal lines connected to the pixels PX may be provided on the substrate 1008. For example, signal lines may be the data lines DL, and the connecting lines 200b may be arranged between the data lines DE and the pad area PADA to transmit data signals supplied from pads of the pad area PADA to the data lines DL.

The connecting lines 200b may include the first connecting lines 210, second connecting lines 230, and third connecting lines 250. The first connecting lines 210 may be arranged in the display area DA, and the second connecting lines 230 and the third connecting lines 250 may be arranged in the peripheral area PA. Some of the first connecting lines 210 may be arranged in the dummy area DMA, The second connecting lines 230 and the third connecting lines 250 may be arranged in the fan-out area FOA located in the peripheral area PA. The fan-out area FOA may be located between the pad area PADA and the display area DA.

The display area DA may include a fourth area S4 and a fifth area S5 in which the first connecting lines 210 are arranged and a sixth area. S6, which is the remaining area excluding the fourth area S4 and the fifth area S5. The fourth area S4 may be a left area of a first central line CL1. The fifth area S5 may be a right area of the first central line CL1. The first central line CL1 may be an imaginary line passing through a center of the display panel 108 in the first direction D1. First connecting lines 210aA arranged in the fourth area S4 and first connecting lines 210bA arranged in the fifth area S5 may be substantially and vertically symmetric about the first central CL1. The sixth area S6 may be an area having no first connecting lines 210 arranged therein. The fourth area S4 and the fifth area S5 may each have a substantially triangular shape. The fourth area S4 may include a first sub-area S4a where the first connecting lines 210aA extend from the fourth edge E4 in a direction away from the peripheral area PA and a second sub-area S4b where the first connecting lines 210aA extend towards the first corner CN1 by changing the direction thereof in the first sub-area S4a. The first sub-area S4a and the second sub-area S4b may each have a substantially right triangle shape. The fifth area S5 may include a third sub-area S5a where the first connecting lines 210bA extend from the fourth edge E4 in a direction away from the peripheral area PA and a fourth sub-area S5b where the first connecting lines 210bA extend towards the second corner CN2 by changing the direction thereof in the third sub-area. S5a. The third sub-area S5a and the fourth sub-area S5b may each have a substantially right triangle shape.

The first connecting lines 210aA arranged in the fourth area S4 may each include a first portion 212 and a second portion 214. The first portion 212 may be arranged in the first sub-area S4a and may extend in a diagonal direction from the fourth edge E4 to a second central line CL2, The diagonal direction may be a direction inclined from the first direction D1 or the second direction D2 by a certain angle (for example, an angle greater than 0 degrees and less than 90 degrees). The second portion 214 may be arranged in the second sub-area S4b and may extend in the diagonal direction from the second central line CL2 to the first corner CN For example, the first portion 212 may extend in a first diagonal direction DD1 ascending from the lower right to the upper left, and the second portion 214 may extend in a second diagonal direction DD2 descending from the upper right to the lower left. The second portion 214 may be a portion where the first portion 212 extends by changing a direction thereof at the second central line CL2. According to an exemplary embodiment of the present disclosure, the first portion 212 and the second portion 214 of each of the first connecting lines 210aA may be substantially and vertically symmetric about the second central line CL2. For example, in the first connecting lines 210aA, an angle between an extension direction of the first portion 212 and the first direction D1 or the second direction D2 and an angle between an extension direction of the second portion 214 and the first direction D1 or the second direction D2 may be substantially identical. According to an exemplary embodiment of the present disclosure, in the first connecting lines 210aA, an angle between an extension direction of the first portion 212 and the first direction D1 or the second direction D2 and an angle between an extension direction of the second portion 214 and the first direction D1 or the second direction D2 may be different from each other.

Likewise, the first connecting lines 210bA, arranged in the fifth area S5, may each include a first portion 216 and a second portion 218. The first portion 216 may be arranged in the third sub-area S5a and may extend in the diagonal direction from the fourth edge E4 to a third central line CL3. The second portion 218 may be arranged in the fourth sub-area S5b and may extend in the diagonal direction from the third central line CL3 to the second corner CN2. For example, the first portion 216 may extend in a third diagonal direction DD3 ascending from the lower left to the upper right, and the second portion 218 may extend in a fourth diagonal direction DD4 descending from the upper left to the lower right. The second portion 218 may be a portion where the first portion 216 extends by changing a direction thereof at the third central line CL1. According to an exemplary embodiment of the present disclosure, the first portion 216 and the second portion 218 of each of the first connecting lines 210bA may be substantially and vertically symmetric about the third central line CL3. For example, in the first connecting lines 210bA, an angle between an extension direction of the first portion 216 and the first direction D1 or the second direction D2 and an angle between an extension direction of the second portion 218 and the first direction D1 or the second direction D2 may be substantially identical, According to an exemplary embodiment of the present disclosure, in the first connecting lines 210bA, an angle between an extension direction of the first portion 216 and the first direction D1 or the second direction D2 and an angle between an extension direction of the second portion 218 and the first direction D1 or the second direction D2 may be different from each other.

The first to fourth diagonal directions DD1 to DD4 may be directions between the first direction D1 and the second direction D2, the directions inclined with respect to the first direction D1 or the second direction D2 by a certain angle.

Referring to FIGS. 8 and 9, the first connecting lines 210aA may be located on different layers from the scan lines SL and the data lines DL of the pixel PX. One end of the first connecting line 210aA may be connected to the first data line DL1, and the other end thereof may be connected to the second connecting line 230. One end of the first connecting line 210aA may be connected to the first data line DL1 in the dummy area DMA located at the first corner CN1. For example, the second portion 214 of the first connecting line 210aA may be connected to the first data line DL1 in a second contact portion CNT2 located in the dummy area DMA.

The first portion 212 of the first connecting line 210aA may be connected to the second connecting line 230. According to an exemplary embodiment of the present disclosure, the second connecting line 230 may be a portion where the first portion 212 of the first connecting line 210aA extends to the peripheral area PA via the dummy area DMA. One end of the second connecting line 230 may be connected to the other end of the first connecting line 210aA, and the other end of the second connecting line 230 may be located in the pad area PADA. The other end of the second connecting line 230 may be connected to a pad arranged in the pad area PADA.

One end of the third connecting line 250 may be connected to the second data line DL2, and the other end of the third connecting line 250 may be located in the pad area PADA. The other end of the third connecting line 250 may be connected to a pad arranged in the pad area PADA. One end of the third connecting line 250 may be connected to the second data line DL2 in the peripheral area PA or the dummy area. DMA, The third connecting line 250 may be a portion where the second data line DL2 extends to the peripheral area. PA via the dummy area DMA.

Likewise, the first connecting lines 210bA may be located on different layers from the scan lines SL and the data lines DL of the pixel PX. One end of the first connecting line 210bA may be connected to the first data line DL1, and the other end of the first connecting line 210bA may be connected to the second connecting line 230. One end of the first connecting line 210bA may be connected to the first data line DL1 in the dummy area DMA located at the second corner CN2. For example, the second portion 218 of the first connecting line 210bA may be connected to the first data line DL1 in the second contact portion CNT2 located in the dummy area DMA.

The first portion 216 of the first connecting line 210bA may be connected to the second connecting line 230. According to an exemplary embodiment of the present disclosure, the second connecting line 230 may be a portion where the first portion 216 of the first connecting line 210bA extends to the peripheral area PA via the dummy area DMA. One end of the second connecting line 230 may be connected to the other end of the first connecting line 210bA, and the other end of the second connecting line 230 may be connected to a pad of the pad area PADA.

One end of the third connecting line 250 may be connected to the second data line DL2, and the other end of the third connecting line 250 may be connected to a pad of the pad area PADA. One end of the third connecting line 250 may be connected to the second data line DL2 in the peripheral area PA or the dummy area DMA. The third connecting line 250 may be a portion where the second data line DL2 extends to the peripheral area PA via the dummy area DMA.

The first data lines DL1 are data lines adjacent to the first corner CN1 and the second corner CN2 and connected to the first connecting lines 210aA and 210bA from among the data lines DL. The second data lines DL2 are data lines excluding the first data lines DL1, for example, data lines that are not connected to the first connecting lines 210aA and 210bA, from among the data lines DL.

The first connecting lines 210aA and the second connecting lines 230 may connect the first data lines DL1 arranged on a left side of the second central line CL2 and pads of the pad area PADA. The first connecting lines 210bA and the second connecting lines 230 may connect the first data lines DL1 arranged on a right side of the third central line CL3 to pads of the pad area PADA, As the first connecting lines 210 are arranged in the display area DA to connect the first data lines DL to the second connecting lines 230, the peripheral area PA around the first corner CN1 and the second corner CN2 may be reduced, and thus, a dead space may be reduced without a decrease in the display area DA at the first corner CN1 and the second corner CN2.

The first data lines DL1 each having one end located at the first corner CN1 may be connected to the first connecting lines 210aA and thus may be electrically connected to the second connecting lines 230. The first data lines DL1 each having one end located at the second corner CN2 may be connected to the first connecting lines 210bA and thus may be electrically connected to the second connecting lines 230. The second data lines DL2 spaced apart from the first corner CN1 and the second corner CN2 by a certain distance may be directly connected to the third connecting lines 250.

Each of the first portion 212 and the second portion 214 of the first connecting line 210aA may extend alternating between a first sub-portion 211a parallel to the scan line SL and a second sub-portion 211b parallel to the data line DL. Each of the first portion 216 and the second portion 218 of the first connecting line 210bA may extend alternating between the first sub-portion 211a parallel to the scan line SL and the second sub-portion 211b parallel to the data line DE. The first sub-portion 211a of the first connecting lines 210aA and 210bA may extend parallel to the scan line SL as far as a first length corresponding to a distance between two adjacent data lines DL. The second sub-portion 211b of the first connecting lines 210aA and 210bA may extend parallel to the data line DL as far as a second length corresponding to a distance between two adjacent scan lines SL. The first sub-portion 211a of the first connecting lines 210aA and 210bA may overlap or be adjacent to the scan line SL. The second sub-portion 211b of the first connecting lines 210aA and 210bA may overlap or be adjacent to the data line DL.

The embodiment illustrated in FIGS. 8 and 9 is an example in which the first connecting lines 210aA and 210bA each extend overlapping the scan line SL as far as the first length and then are bent to each extend overlapping the data line DL as far as the second length. For example, the first portion 212 of the first connecting line 210aA may zigzag in the first diagonal direction DD1 on the whole as the first sub-portion 211a and the second sub-portion 211b are repeated, and the second portion 214 may zigzag in the second diagonal direction DD2 on the whole as the first sub-portion 211a and the second sub-portion 211b are repeated. The first portion 216 of the first connecting line 210bA may zigzag in the third diagonal direction DD3 on the whole as the first sub-portion 211a and the second sub-portion 211b are repeated, and the second portion 218 may zigzag in the fourth diagonal direction DD4 on the Whole as the first sub-portion 211a and the second sub-portion 211b are repeated. For example, the first connecting lines 210 may be step-pattern (or zigzag-pattern) wires having a shape of gradually ascending or descending in any one direction and including the first sub-portions 211a and the second sub-portions 211b, which are alternately connected. The first sub-portion 211a and the second sub-portion 211b may be connected to each other while substantially crossing, at right angles. Accordingly; the first connecting lines 210 may overlap the scan lines SL of a plurality of rows and may overlap the data lines DL of a plurality of columns.

The first portion 201a of each of the first connecting lines 201 in the embodiment illustrated in FIG. 1 extends parallel to one scan line SL arranged in one row. The plurality of pixels PX may be connected to the scan line SL of each row, and scan signal may be simultaneously applied to the plurality of pixels PX in each row. As the first portion 201a of the first connecting line 201 extends parallel to one scan line SL n times as far as the first length, a parasitic capacitor may be formed between the first portion 201a of the first connecting line 201 and the scan line SL, and thus, coupling may occur. Accordingly, a data signal which is transmitted to the data line DL connected to the first connecting line 201 may change, and thus, degradation of picture quality due to diagonal spots may occur.

In the embodiment illustrated in FIG. 7, the first connecting lines 210 may extends in a zigzag shape via the plurality of pixels PX of a plurality of rows and a plurality of columns. For example, the first sub-portions 211a of the first connecting line 210 may be located in different rows, and accordingly, a length at which the first sub-portion 211a overlaps the scan line SL each row may be decreased compared to the embodiment illustrated in FIG. 1. Scan signals may be applied to the plurality of scan lines SL arranged in different rows at different timings, and a parasitic capacitor between the first connecting line 210 and the scan lines SL may be distributed among a plurality of rows and thus parasitic capacitance may decrease. Accordingly, degradation of picture quality due to diagonal spots may be prevented by reducing an influence of the scan line SL on a data signal.

As illustrated in FIG. 10, first pattern areas X1 defined between adjacent first connecting lines 210aA may be located in the fourth area S4. Dummy patterns 220c1 and 220d1 may be arranged in the first pattern area X1. The first pattern areas X1 defined by the first connecting lines 210bA may be located in the fifth area S5.

The first connecting lines 210 and the dummy patterns 220c1 and 220d1 of the first pattern area X1 may be arranged on the same layer. The dummy patterns 220c1 and 220d1 of the first pattern area X1 may be in a floating state.

Since reflection characteristics of light become similar in the fourth area. S4 and the fifth area S5 due to the first pattern areas X1, it may become difficult to recognize a division between the fourth area S4 and the fifth area S5 according to an incidence angle of light. Dummy patterns may prevent signal interference from occurring between a pixel circuit and a first connecting line and may make it easier to manufacture by securing pattern density.

As illustrated in FIG. 10, the first sub-portions 211a of an adjacent pair of first connecting lines 210aA and 210bA may be spaced apart from each other by a length (the second length) corresponding to a distance between two adjacent scan lines SL in the second direction D2, The second sub-portions 211b of the adjacent pair of first connecting lines 210aA and 210bA may be spaced apart from each other by a length (the first length) corresponding to a distance between two adjacent data lines DL in the first direction D1.

A display element may be arranged on the first connecting lines 210, Hereinafter, descriptions will be given with reference to FIGS. 11 and 12.

Figure 11:
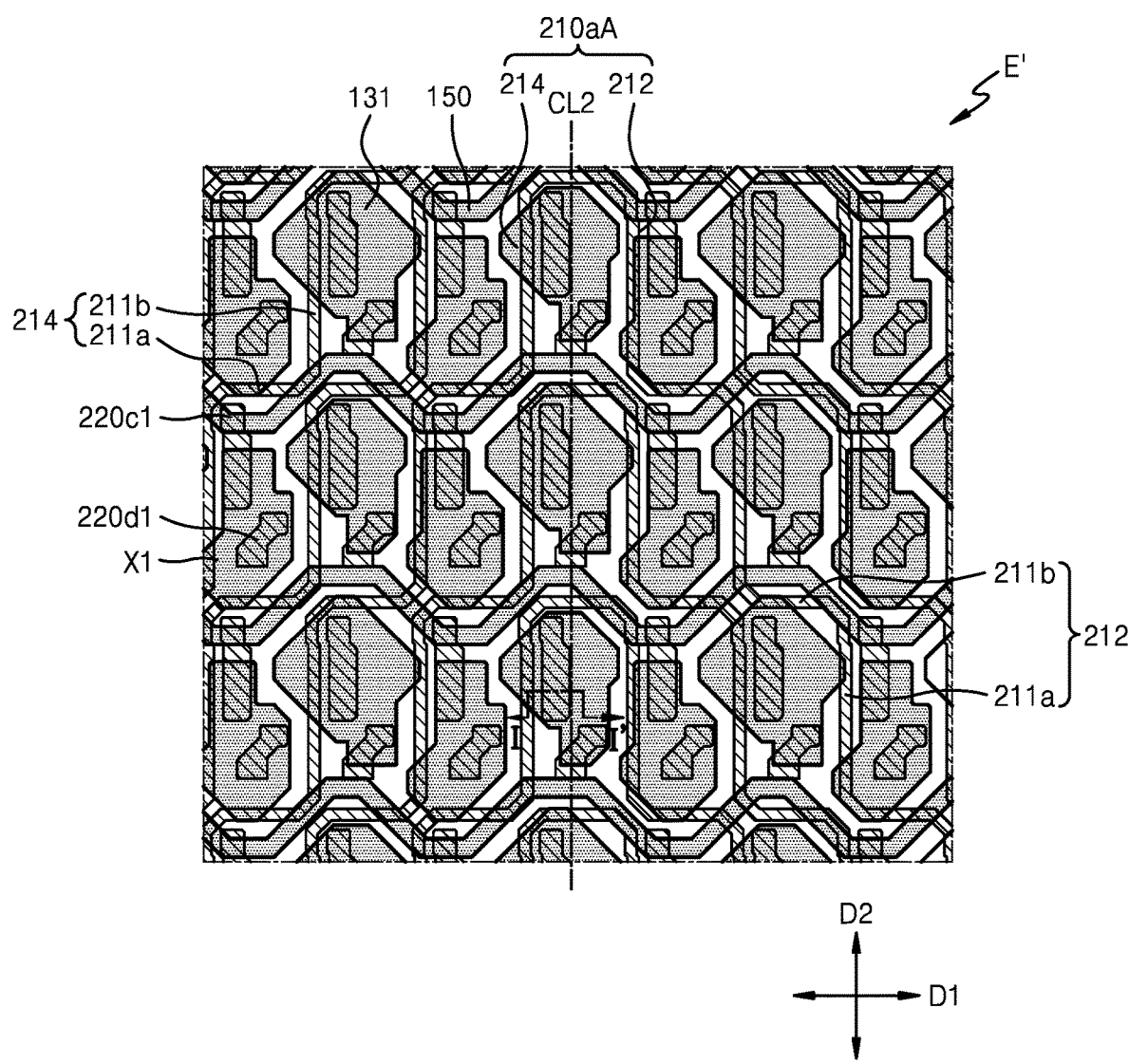
FIG. 11 illustrates an example in which a pixel electrode and a shielding member are arranged on first connecting lines according to an exemplary embodiment of the present disclosure.
Figure 12:
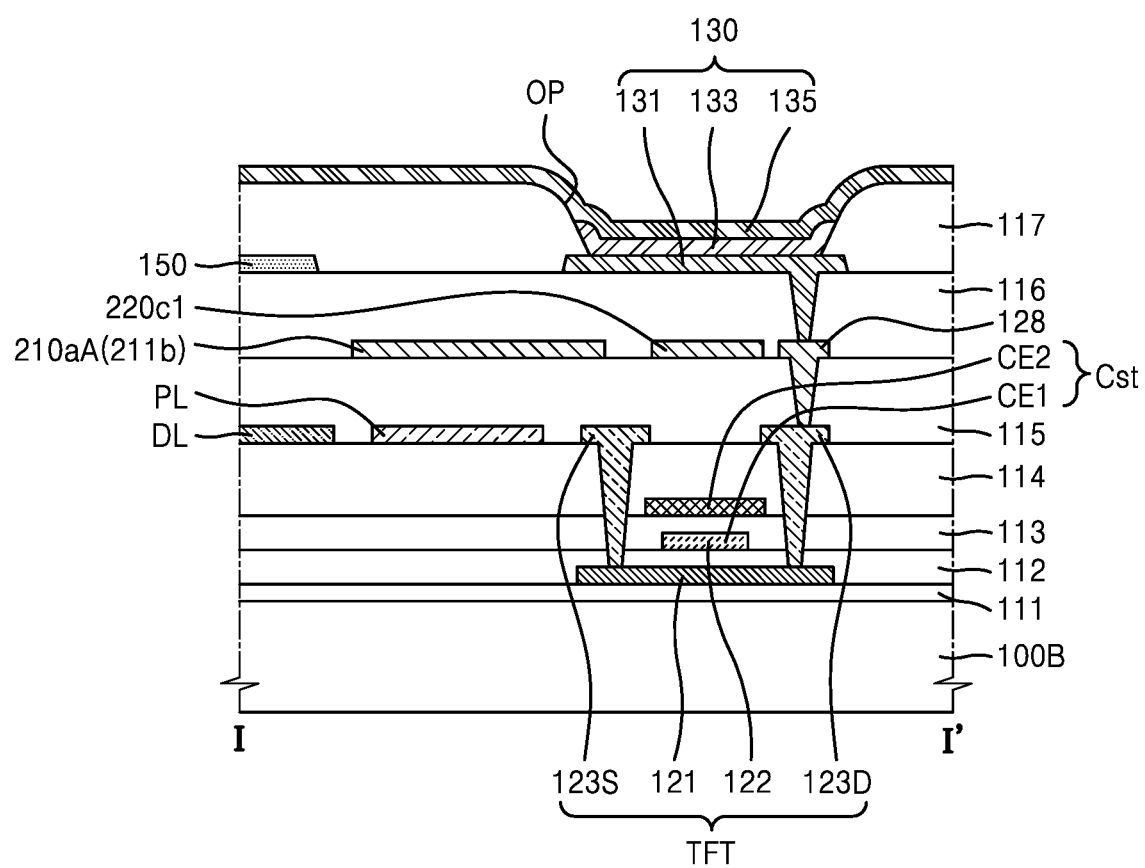
FIG. 12 is a cross-sectional view taken along line I-I' of FIG. 11.

FIG. 11 illustrates an example in which a pixel electrode 131 and a shielding member 150 are arranged on the first connecting lines 210. FIG. 12 is a cross-sectional view taken along line I-I' of FIG. 11.

The plurality of pixels PX may be arranged in the display area DA of the substrate 100B. A thin film transistor TFT, the capacitor Cst, and a display element 130 electrically connected to the thin film transistor TFT may be arranged in each pixel PX. The display element 130 may be the organic light-emitting diode OLED of FIGS. 6A and 6B. The thin film transistor TFT may be one of the transistors of FIGS. 6A and 6B. For example, the thin film transistor TFT illustrated in FIG. 12 may be the first transistor T1 of FIGS. 6A and 6B.

A buffer layer 111 may be located on the substrate 100B as desired. The buffer layer 111 may planarize a surface of the substrate 10018 or may prevent impurities, etc. from penetrating, a semiconductor layer arranged thereon. The buffer layer 111 may have a single-layer/multilayer structure including an inorganic insulating material such as silicon oxide, silicon nitride, and/or silicon oxynitride. The buffer layer 111 may be omitted.

The thin film transistor TFT may be arranged on the buffer layer 111. The thin film transistor TFT may include a semiconductor layer 121, a gate electrode 122, a source electrode 123S, and a drain electrode 123D.

The semiconductor layer 121 may include amorphous silicon, polycrystalline silicon, and/or an organic semiconductor material. The semiconductor layer 121 may include a source region, a drain region, and a channel region between the source region and the drain region.

Taking into account factors such, as adhesion to a neighboring layer, surface smoothness of a layer to be stacked, and processability, the gate electrode 122 may have a single-layer or multilayer structure including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

A first insulating layer 112 may be arranged between the semiconductor layer 121 and the gate electrode 122. A second insulating layer 113 and a third insulating layer 114 may each be arranged between the gate electrode 122 and the source and drain electrodes 123S and 123D. The first insulating layer 112, the second insulating layer 113, and the third insulating layer 114 may include an inorganic material such as silicon oxide, silicon nitride and/or silicon oxynitride. The scan lines SL, SL1, and SL2 and the emission control line EL of FIGS. 6A and 6B may be arranged on the same layer as the gate electrode 122, for example, on the first insulating layer 112.

The source electrode 123S and the drain electrode 123D may be electrically connected to the source region and the drain region of the semiconductor layer 121, respectively, via contact holes formed in the first insulating layer 112, the second insulating layer 113, and the third insulating layer 114.

The source electrode 123S and the drain electrode 123D may have a single-layer or multilayer structure including for example, aluminum (Al), platinum (Pt), palladium (Pd), silver (Ag), magnesium (Mg), gold (Au), nickel (Ni), neodymium (Nd), iridium at), chromium (Cr), lithium (Li), calcium (Ca), molybdenum (Mo), titanium (Ti), tungsten (W), and/or copper (Cu).

The capacitor Cst includes a lower electrode CE1 and an upper electrode CE2 overlapping each other with the second insulating layer 113 disposed therebetween. The capacitor Cst may overlap the thin film transistor TFT. In this regard. FIG. 12 illustrates the gate electrode 122 of the thin film transistor TFT being the lower electrode CE1 of the capacitor Cst. According to an exemplary embodiment of the present disclosure, the capacitor Cst might not overlap the thin film transistor TFT, and the lower electrode CE1 of the capacitor Cst may be an independent element separate from the gate electrode 122 of the thin film transistor TFT. The capacitor Cst may be covered by the third insulating layer 114. The initialization voltage line VIL of FIG. 6B may be arranged on the same layer as the upper electrode CE2 of the capacitor Cst, for example, on the second insulating layer 113.

The pixel circuit including the thin film transistor TFT and the capacitor Cst may be covered by a fourth insulating layer 115 and a fifth insulating layer 116. The fourth insulating layer 115 and the fifth insulating layer 116, which are planarization insulating layers, may be organic insulating layers. The fourth insulating layer 115 and the fifth insulating layer 116 may include an organic insulating material such as a general-purpose polymer such as poly(methyl methacrylate) (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, a blend thereof etc. According to an exemplary embodiment of the present disclosure, the fourth insulating laser 115 and the fifth insulating layer 116 may each include polyimide.

Various conductive layers may be further arranged on the third insulating layer 114. For example, the data line DL and the power voltage line PL may be arranged on the third insulating layer 114, for example, on the same layer as the source electrode 123S and the drain electrode 1231). The data line DL and the power voltage line PL may include magnesium (Mg), aluminum (Al), copper (Cu), titanium (Ti), etc. and may have a multilayer or single-layer structure. According to an exemplary embodiment of the present disclosure, the data line DL and the power voltage line PL may have a multilayer structure of Ti/Al/Ti.

The fourth insulating layer 115 may be arranged on the data line DL and the power voltage line PL. As illustrated in FIG. 10, the first connecting line 210 and the dummy patterns 22001 and 220d1 may be arranged on the fourth insulating layer 115. The first connecting line 210 and the dummy patterns 220c1 and 220d may be single films or multilayered films including magnesium (Mg), aluminum (Al), copper (Cu), titanium (Ti), and/or an alloy thereof. According to an exemplary embodiment of the present disclosure, the first connecting line 210 and the dummy patterns 220c1 and 220d1 may have a multilayer structure of Ti/Al/Ti. The fifth insulating layer 116 may be arranged on the first connecting line 210 and the dummy patterns 220c1 and 220d1. According to an exemplary embodiment of the present disclosure, a portion of the first connecting line 210 may overlap or be adjacent to the data line DL, and the other portion thereof may overlap or be adjacent to the scan line SL. FIG. 12 illustrates an example in which the second portion 211b of the first connecting line 210 (210aA, 210bA) is adjacent to the data line DL and overlaps the power voltage line PL. The first portion 211a of the first connecting line 210 (210aA, 210bA) may overlap or be adjacent to the scan line SL.

The display element 130 may be arranged on the fifth insulating layer 116, The display element 130 may include the pixel electrode 131, an opposite electrode 135, and an intermediate layer 133 between the pixel electrode 131 and the opposite electrode 135.

The pixel electrode 131 may include conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). According to an exemplary embodiment of the present disclosure, the pixel electrode 131 may include a reflecting film including silver (Ag), magnesium (Mg), aluminum (Al), platinum (Pt), palladium (Pd), gold (Au), nickel (Ni), neodymium (Nd), iridium (h), chromium (Cr), and/or a compound thereof. According to an exemplary embodiment of the present disclosure, the pixel electrode 131 may further include a film on/under the above-described reflecting film, the film including ITO, IZO, ZnO, and/or $In_2O_3$. The pixel electrode 131 may be electrically connected to the source electrode 123S or the drain electrode 123D of the thin film transistor TFT through a connecting member 12S arranged on the fourth insulating layer 115.

The shielding member 150 may be further arranged on the fifth insulating layer 116, The shielding member 150 may extend along a portion of the edge of the pixel, electrode 131 in the first direction D1 not to overlap the pixel electrode 131 in plan view and may be arranged on an upper side or a lower side of each row. The shielding member 150 may have a linear shape or a zigzag shape extending in the first direction D1, according to arrangement of the pixel electrodes 131 of the same row. The shielding member 150 may include lightproof metal. For example, the shielding member 150 may include magnesium (Mg), aluminum (Al), copper (Cu), titanium (Ti), etc. and may have a multilayer or single-layer structure including the above material. According to an exemplary embodiment of the present disclosure, the shielding member 150 may have a multilayer structure of Ti/Al/Ti. The shielding member 150 may include the same material as the pixel electrode 131. The shielding members 150 may be mutually spaced apart and may be independently provided for each row. The shielding members 150 may be floating, or may be electrically connected to a constant voltage wire (for example, a power voltage line, an initialization voltage line, etc.) to receive constant voltage.

A sixth insulating layer 117 covering the edge of the pixel electrode 131 may be arranged on the fifth insulating layer 116. The sixth insulating layer 117 may have an opening OP partially exposing the pixel electrode 131 and thus may define a pixel. The sixth insulating layer 117 may include an organic material such as acryl, benzocyclobutene polyimide, or hexamethyldisiloxane (HMDSO). Alternatively, the sixth insulating layer 117 may include the above-described inorganic material.

The intermediate layer 133 may be on the pixel electrode 131 exposed by the opening OP of the sixth insulating layer 117. The intermediate layer 133 includes an emission layer. The emission layer may include a polymer or low-molecular weight organic material emitting light having certain color. The emission layer may be a red emission layer, a green emission layer, or a blue emission layer. Alternatively, the emission layer may have a multilayer structure in which a red emission layer, a green, emission layer, and a blue emission layer are stacked to emit white light or may have a single-layer structure including a red luminescent material, a green luminescent material, and a blue luminescent material. According to an exemplary embodiment of the present disclosure, the intermediate layer 133 may include a first functional layer under the emission layer and/or a second functional layer on the emission layer. The first functional layer and/or the second functional layer may include an integral layer over a plurality of pixel electrodes 131 or may include a layer patterned to correspond to each of the plurality of pixel electrodes 131.

The first functional layer may have a single-layer or multilayer structure. For example, when the first functional layer includes a polymer material, the first functional layer may be a hole transport layer (HTL) having a single-layer structure and may include poly-(3,4)-ethylene-dihydroxy thiophene (PEDOT) or polyaniline (PANI). When the first functional layer includes a low-molecular weight material, the first functional layer may include a hole injection layer (HIL) and an HTL.

The second functional layer is not always provided. For example, when the first functional layer and the emission layer include a polymer material, the second functional layer may be formed to make characteristics of an organic light-emitting diode excellent. The second functional layer may have a single-layer or multilayer structure. The second functional layer may include an electron transport layer (ETL) and/or an electron injection layer (EIL).

The opposite electrode 135 faces the pixel electrode 131 with the intermediate layer 133 disposed therebetween. The opposite electrode 135 may include a conductive material having a low work function. For example, the opposite electrode 135 may include a (semi)transparent layer including silver (Ag), magnesium (Mg), aluminum (Al), platinum (Pt), palladium (pd), gold (Au), nickel (Ni), neodymium (Nd), (it), chromium (Cr), lithium (Li), calcium (Ca), or an alloy thereof. Alternatively, the opposite electrode 135 may further include a layer such as ITO, IZO, ZnO, or $In_2O_3$ on the (semi) transparent layer including the above-described material. As used herein, the phrase "low work function" may be understood to mean a work function that is within the range of the work functions, or lower that the work functions, for the materials listed above.

Figure 13:
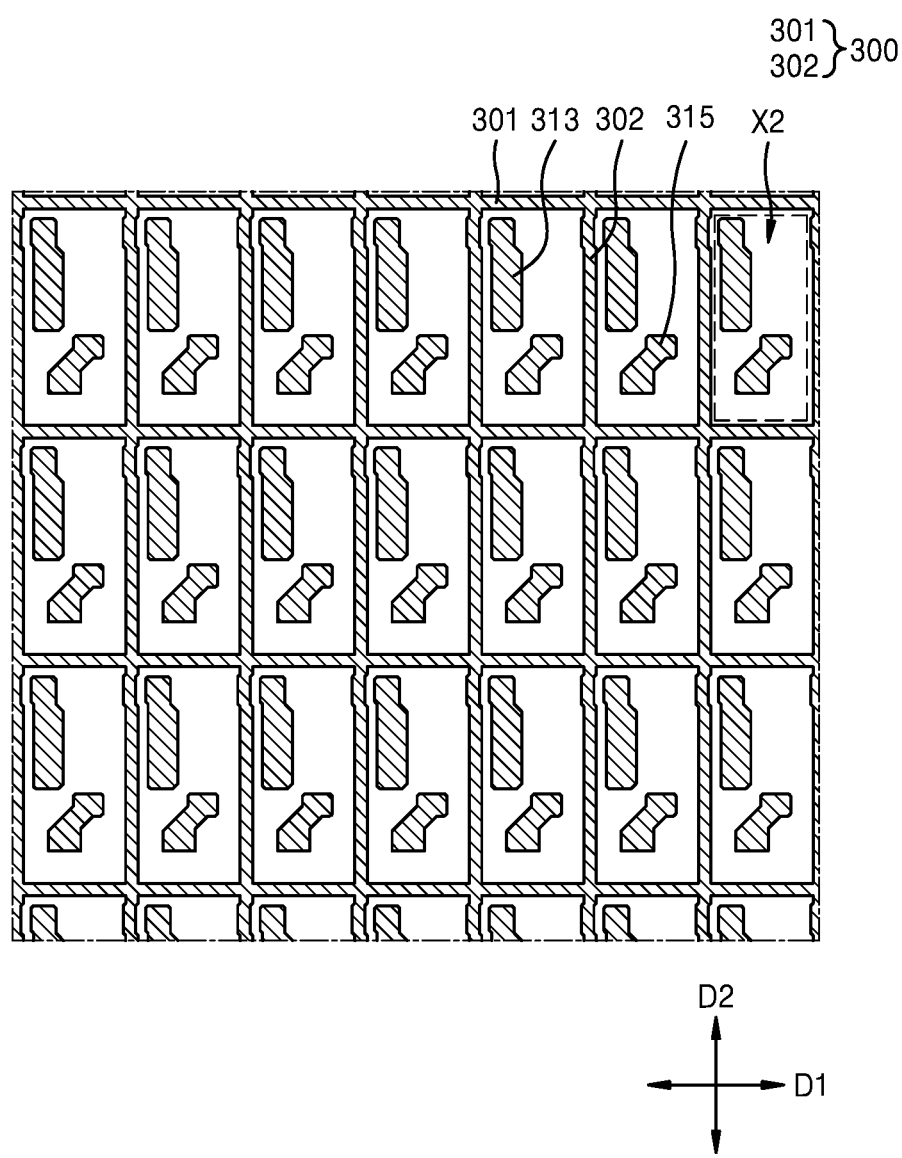
FIG. 13 is a plan view schematically illustrating an example of a sixth area of FIG. 7.
Figure 14:
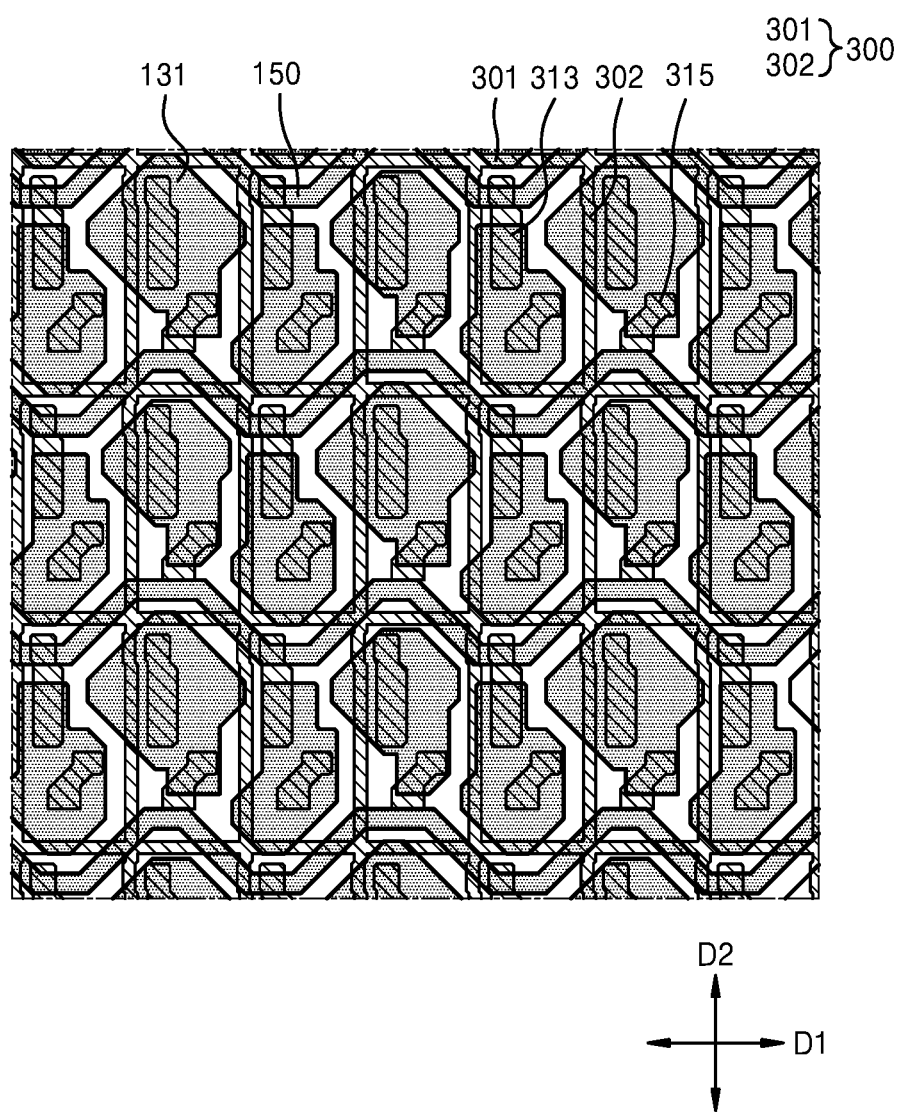
FIG. 14 is a plan view schematically illustrating an example of a sixth area of FIG. 7.

FIGS. 13 and 14 are plan views schematically illustrating an example of the sixth area S6 of FIG. 7.

Referring to FIG. 13, a dummy line 300 may be arranged in the sixth area S6. The dummy line 300 may include a plurality of first portions 101 extending in the first direction D1 and mutually spaced apart and a plurality of second portions 302 extending in the second direction D2, crossing the first portions 301, and mutually spaced apart. The dummy line 300 may have a grid structure in which the plurality of first portions 301 and the plurality of second portions 302 are mutually connected. In the sixth area S6, second pattern areas X2 may be defined by the dummy line 300. A plurality of dummy patterns 313 and 315 may be arranged in the second pattern area X2. The dummy line 300 and the dummy patterns 313 and 315 may be in a floating state. According to an exemplary embodiment of the present disclosure, the dummy line 300 and the dummy patterns 313 and 315 may be electrically connected to the power voltage line PL to receive the first power voltage ELVDD. In this case, the dummy line 300 and the dummy patterns 313 and 315 may serve as a portion of the power voltage line PL in the sixth area S6 and thus may allow the power voltage line PL to have a dual wire structure, thereby preventing a voltage drop of the power voltage line PL.

The dummy line 300 and the dummy patterns 313 and 315 may be arranged on the same layer. The dummy line 300 may be arranged on the same layer as the first connecting lines 210. The dummy line 300 and the dummy patterns 313 and 315 may be insulated from the first connecting lines 210. The dummy line 300 may include the same material as the first connecting lines 210, The fifth insulating layer 116 (of FIG. 12) may be arranged on the dummy line 300 and the dummy patterns 313 and 315, and as illustrated in FIG. 14, the display element 130 and the shielding member 150 may be arranged on the fifth insulating layer 116.

Figure 15A:
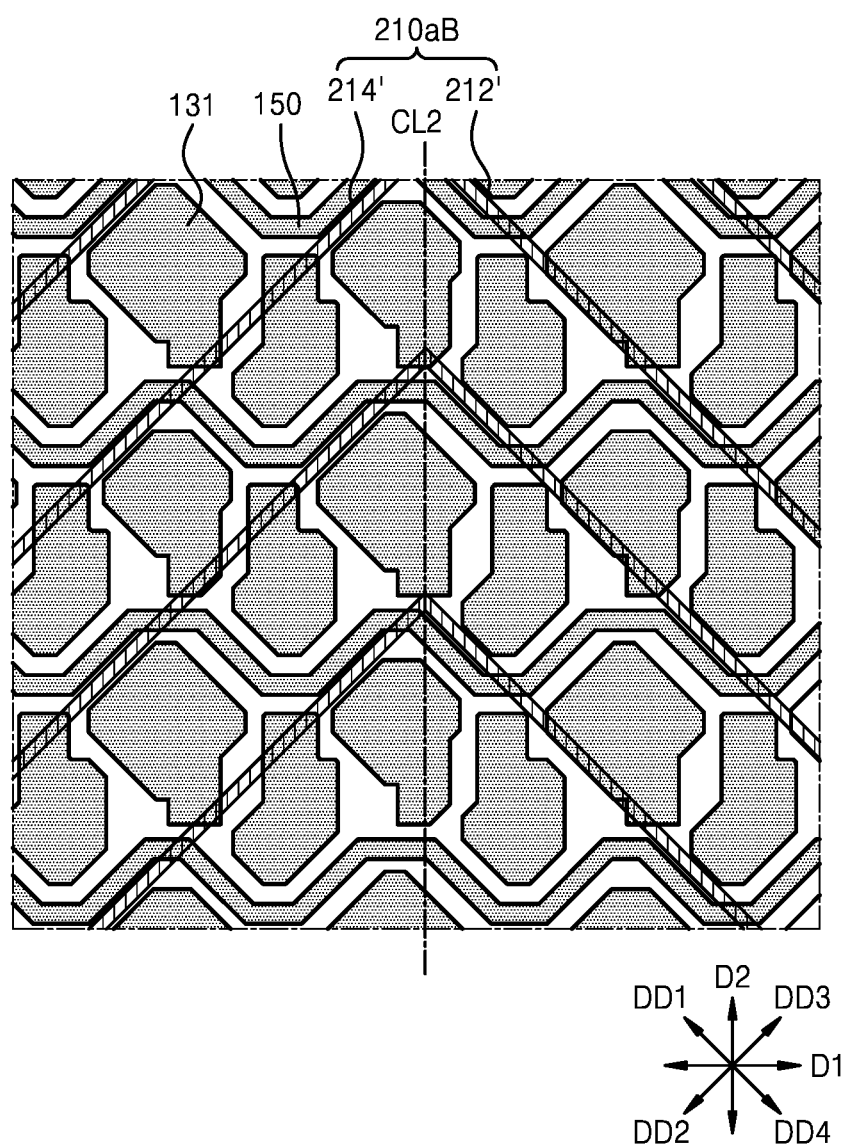
FIGS. 15A and 15B are plan views illustrating arrangement of the first connecting line according to an exemplary embodiment of the present disclosure.
Figure 15B:
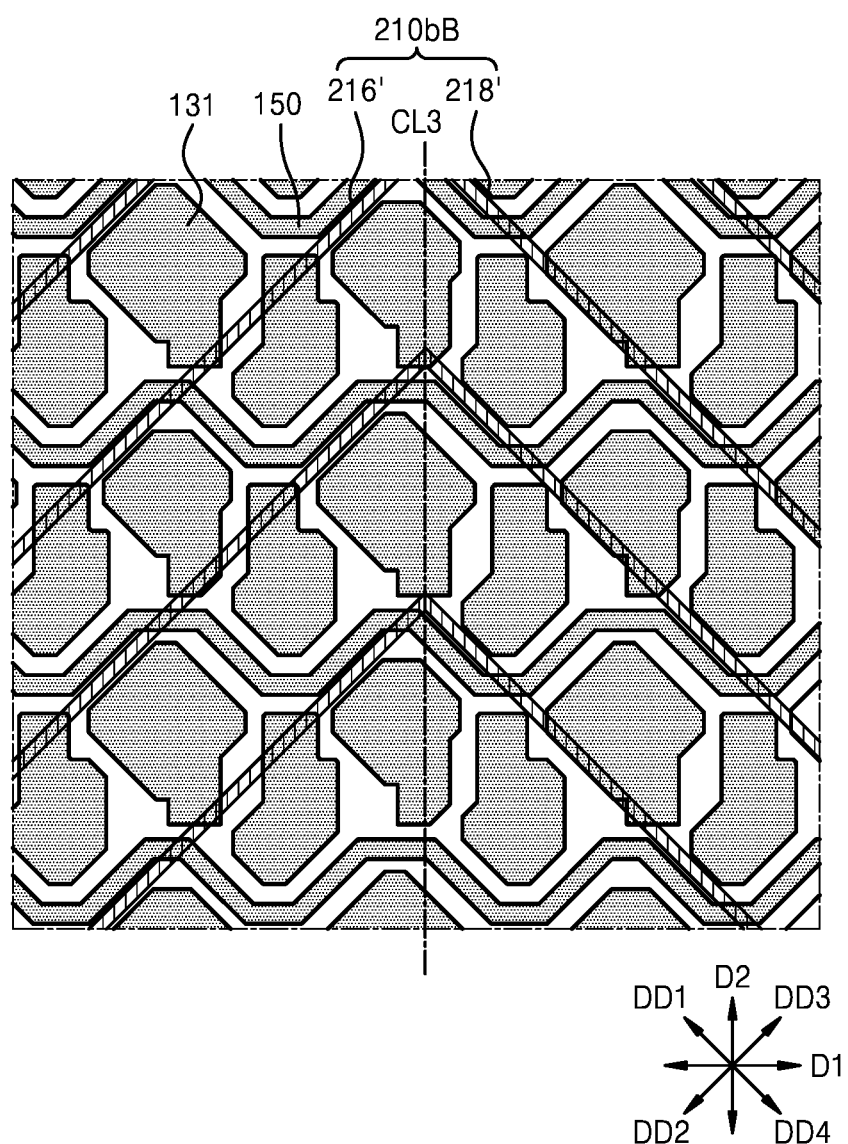

FIGS. 15A and 15B are plan views illustrating arrangement of the first connecting line 210 according to an exemplary embodiment of the present disclosure. FIG. 15A may be an enlarged view of part E of FIG. 7.

The first connecting line 210 may include first connecting lines 210aB arranged in the fourth area S4 and first connecting: lines 210bB arranged in the fifth area S5.

Referring to FIG. 15A, each of the first connecting lines 210aB may include a first portion 212' located on a right side of the second central line CL2 and a second portion 214' located on a left side of the second central line CL2. The first portion 212' may be arranged in the first sub-area S4a and may extend in a diagonal direction from the fourth edge E4 to the second central line CL2. The diagonal direction may be a direction inclined from the first direction D1 or the second direction D2 by a certain angle (for example, an angle greater than 0 degrees and less than 90 degrees). The second portion 214' may be arranged in the second sub-area S4b and may extend in the diagonal direction from the second central line CL2 to the first corner CN1. For example, the first portion 212' may extend in the first diagonal direction DD1, and the second portion 214 may extend in the second diagonal direction DD2. The second portion 214' may be a portion where the first portion 212' extends by changing a direction thereof at the second central line CL2. According to an exemplary embodiment of the present disclosure, the first portion 212' and the second portion 214' of each of the first connecting lines 210aB may be substantially symmetric about the second central line CL2. For example, in the first connecting lines 210aB, an angle between an extension direction of the first portion 212' and the first direction D1 or the second direction D2 and an angle between an extension direction of the second portion 214 and the first direction D1 or the second direction D2 may be substantially identical. According to an exemplary embodiment of the present disclosure, in the first connecting lines 210aB, an angle between an extension direction of the first portion 212' and the first direction D1 or the second direction D2 and an angle between an extension direction of the second portion 214' and the first direction D1 or the second direction D2 may be different from each other. The first portion 212' may be connected to the second connecting line 230, The second portion 214' may be electrically connected to the first data line DL1 in the dummy area DMA located at the first corner CN1.

The fifth insulating layer 116 (of FIG. 12) may be arranged on the first connecting lines 210aB, and the pixel electrode 131 of the display element 130 and the shielding member 150 may be arranged on the fifth insulating layer 116. An area of the pixel electrode 131 where the emission layer is arranged might not overlap the first connecting line 210aB.

Likewise, referring to FIG. 15B, each of the first connecting lines 210bB may include a first portion 216' located on, a left side of the third central line CL3 and a second portion 218' located on a right side of the third central line CL3. The first portion 216' may be arranged in the third sub-area S5a and may extend in the diagonal direction from the fourth edge E4 to the third central line CL3. The second portion 218' may be arranged in the fourth sub-area S5b and may extend in the diagonal direction from the third central line CL3 to the second corner CN2. For example, the first portion 216' may extend in the third diagonal direction DD3, and the second portion 218' may extend in the fourth diagonal direction DD4. The second portion 218' may be a portion where the first portion 216' extends by changing a direction thereof at the third central line CD, According to an exemplary embodiment of the present disclosure, the first portion 216' and the second portion 218' of each of the first connecting lines 210bB may be substantially and vertically symmetric about the third central line CL3. For example, in the first connecting lines 210bB, an angle between an extension direction of the first portion 216 and the first direction D1 or the second direction D2 and an angle between an extension direction of the second portion 218' and the first direction D1 or the second direction D2 may be substantially identical. According to an exemplary embodiment of the present disclosure, in the first connecting lines 210bB, an angle between an extension direction of the first portion 216' and the first direction D1 or the second direction D2 and an angle between an extension direction of the second portion 218' and the first direction D1 or the second direction D2 may be different from each other. The first portion 216' may be connected to the second connecting line 230. The second portion 218' may be electrically connected to the first data line DU in the dummy area DMA located at the second corner CN2. The first to fourth diagonal directions DD1 to DD4 may be directions between the first direction D1 and the second direction D2.

The fifth insulating layer 116 (of FIG. 12) may be arranged on the first connecting lines 210bB, and the pixel electrode 131 of the display element 130 and the shielding member 150 may be arranged on the fifth insulating layer 116. An area of the pixel electrode 131 where the emission layer is arranged might not overlap the first connecting line 210bB.

The embodiment of FIGS. 15A and 15B is different from the embodiment of FIG. 10 in which the first connecting lines 210aA and 210bA extend in a zigzag shape, in that the first connecting lines 210aB and 210bB extend linearly. Dummy patterns in various numbers and shapes may be located between the first connecting lines 210aB and 210bB.

Figure 16:
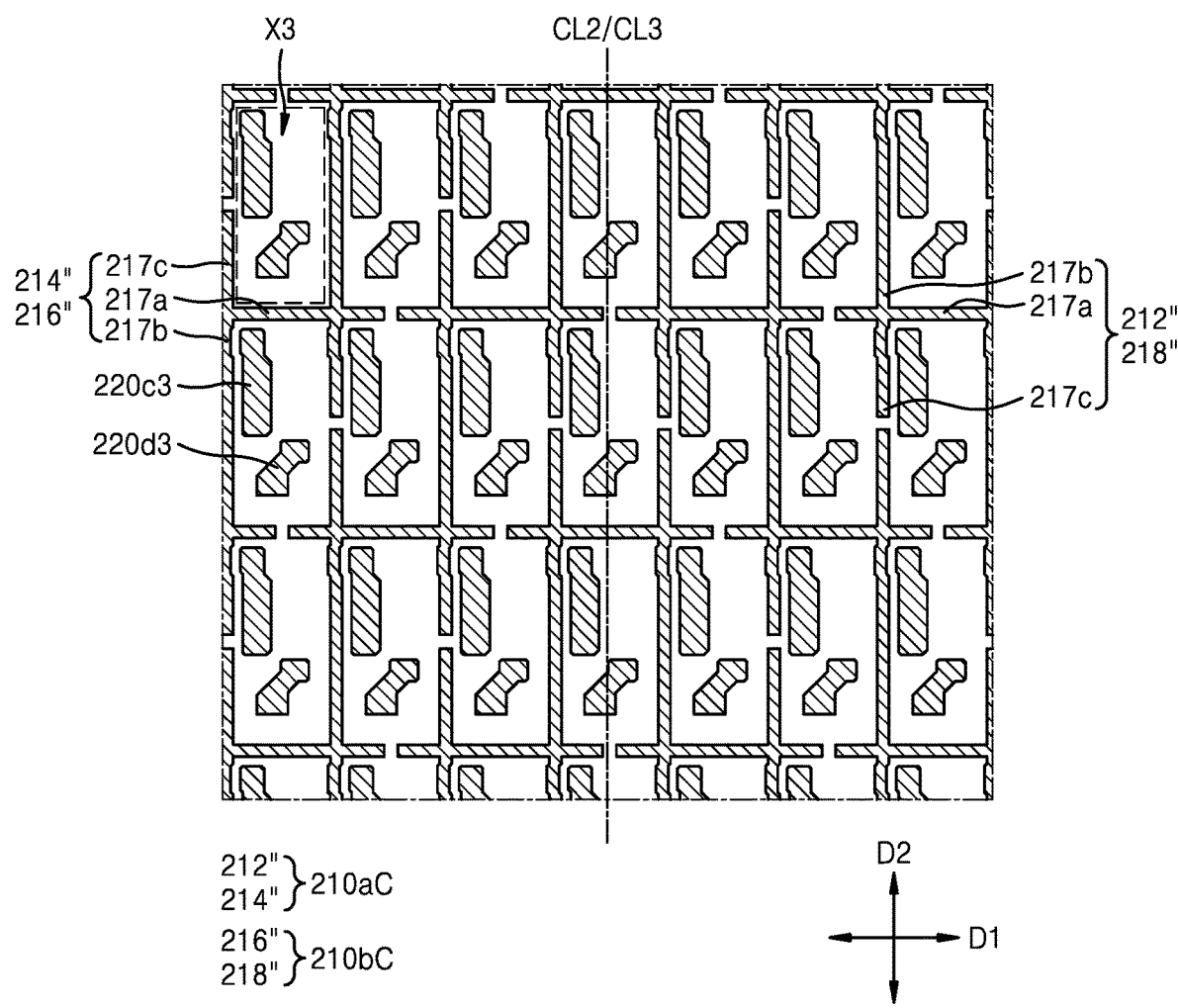
FIG. 16 is a plan view illustrating arrangement of the first connecting line according to an exemplary embodiment of the present disclosure.

FIG. 16 is a plan view illustrating arrangement of the first connecting line 210 according to an exemplary embodiment of the present disclosure.

The first connecting line 210 may include first connecting lines 210aC arranged in the fourth area S4 and first connecting lines 210bC arranged in the fifth area S5. The first connecting lines 210aC may include a first portion 212" located on a right side of the second central line CL2 and a second portion 214" located on a left side of the second central line CL2. The first portion 212" and the second portion 214" may be substantially symmetric about the second central line CL2. The first connecting lines 210bC may include a first portion 216" located on a left side of the third central line CL3 and a second portion 218" located on a right side of the third central line CL3. The first portion 216" and the second portion 218" may be substantially symmetric about the third central line CL3.

Referring to FIG. 16, the first portions 212" and 216" and the second portions 214" and 218" of the first connecting lines 210aC and 210bC may extend alternating a first sub-portion 217a parallel to the scan line SL and a second sub-portion 217b parallel to the data line DL. The first sub-portion 217a of the first connecting lines 210aC and 210bC may extend parallel to the scan line SL as far as the first length. The second sub-portion 217b of the first connecting lines 210aC and 210bC may extend parallel to the data line DL as far as the second length. The first sub-portion 217a of the first connecting lines 210aC and 210bC may overlap or be adjacent to the scan line SL The second sub-portion 2171 of the first connecting lines 210aC and 210bC may overlap or be adjacent to the data line DL.

The embodiment illustrated in FIG. 16 is an example in which the first connecting lines 210aC and 210bC extend overlapping the scan line SL as far as the first length and then are bent to extend overlapping the data line DL as far as the second length. For example, the first portion 212" and the second portion 214" of the first connecting line 210aC may zigzag in the first diagonal direction DD1 and the second diagonal direction DD2 on the whole as the first sub-portion 217a and the second sub-portion 217b are repeated. The first portion 216" and the second portion 218" of the first connecting line 210bC may zigzag in the third diagonal direction DD3 and the fourth diagonal direction DD4 on the whole as the first sub-portion 217a and the second sub-portion 217b are repeated. For example, the first connecting lines 210 may overlap the scan lines SL of a plurality of rows and may overlap the data lines DL of a plurality of columns.

In FIG. 16, the first sub-portions 217a of adjacent first connecting lines 210aC and 210bC are spaced apart from each other by a length corresponding to distances between three scan lines SL adjacent to one another in the second direction D2. The second sub-portions 217b of the adjacent first connecting lines 210aC and 210bC are spaced apart from each other by a length corresponding to distances between three data lines DL adjacent to one another in the first direction D1.

The first connecting lines 210aC and 210bC may further include branches 217c protruding from the first sub-portion 217a and the second sub-portion 217b. The branches 217c may protrude from portions where the first connecting lines 210aC and 210bC are bent, in the first direction D1 and the second direction 12, For example, the branches 217c may protrude from portions where the first sub-portion 217a and the second sub-portion 217b meet each other, for example, a portion where the first sub-portion 217a is bent to the second sub-portion 217b and a portion where the second sub-portion 217b is bent to the first sub-portion 217a, in the first direction D1 and the second direction D2, To prevent a short circuit between the first connecting lines 210aC and 210bC, ends of the branches 217c protruding from adjacent first connecting lines 210aC and 210bC towards each other may be disconnected from each other and spaced apart from each other. The branches 217c protruding from adjacent first connecting lines 210aC and 210bC towards each other may be located on the same line. Dummy patterns 220c3 and 220d3 may be arranged in a third pattern area X3 defined by the first connecting lines 210aC and 210bC. The dummy patterns 220c3 and 220d3 may be in a floating state.

According to the previous embodiments, in the first connecting line 210, a first sub-portion has the first length and a second sub-portion has the second length. However, the present invention is not limited thereto. For example, the first connecting line 210 may extend such that the first sub-portion is n times as long as the first length and the second sub-portion is n times as long as the second length. Alternatively, some of first sub-portions of the first connecting line 210 may have the first length, and the others may be n times as long as the first length. In addition, some of second sub-portions of the first connecting line 210 may have the second length, and the others may be n times as long as the second length.

According to the previous embodiments, the first connecting lines 210 are r wires or step-pattern wires gradually ascending; or descending in any one direction. However, embodiments are not limited thereto. For example, the first connecting lines 210 may be wires where at least one of a portion gradually ascending and/or descending in any one direction, a portion extending in a direction parallel to a data line, and a portion extending in a direction parallel to the scan line is mixed as illustrated in the embodiments described below.

Figure 17:
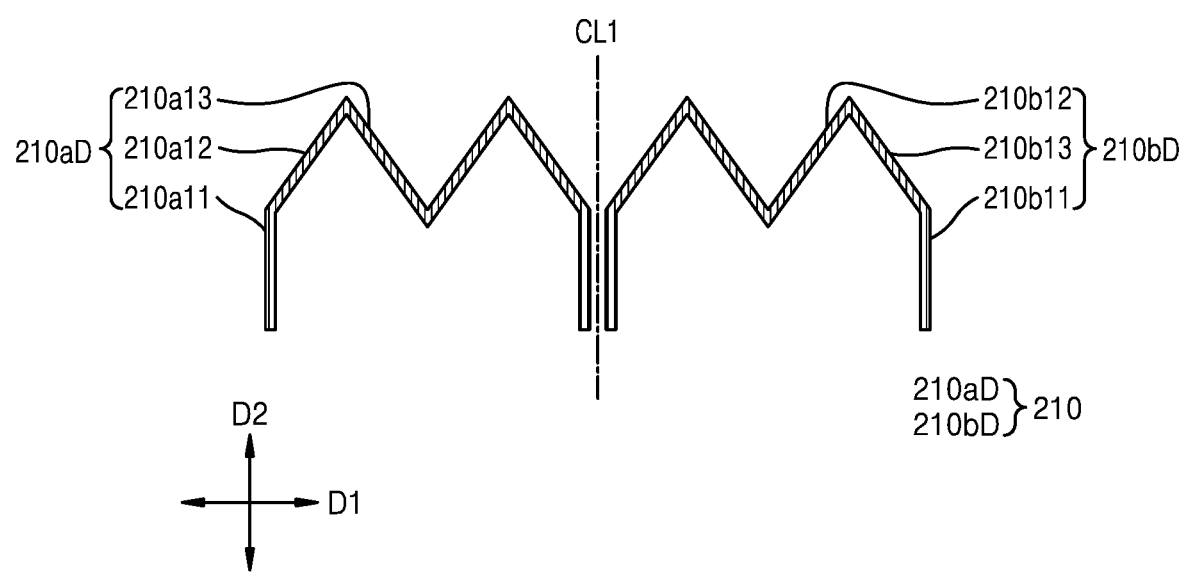
FIG. 17 is a plan view illustrating shapes of the first connecting line according to exemplary embodiments of the present disclosure.
Figure 18:
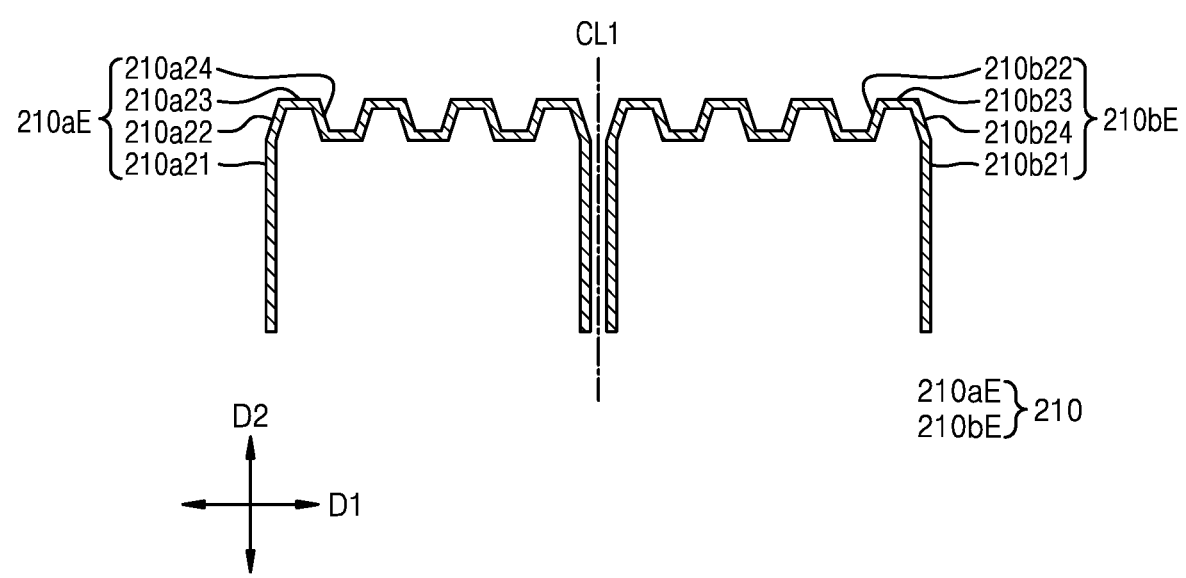
FIG. 18 is a plan view illustrating shapes of the first connecting line according to exemplary embodiments of the present disclosure.

FIGS. 17 and 18 are plan views illustrating shapes of the first connecting line 210 according to exemplary embodiments of the present disclosure.

Referring to FIG. 17, the first connecting lines 210 may include first connecting lines 210aD arranged on a left side of the first central line CL1 and first connecting lines 210bD arranged on a right side of the first central line CL1. According to an exemplary embodiment of the present disclosure, the first connecting lines 210aD and the first connecting lines 210bD may be substantially symmetric about the first central line CL1. According to an exemplary embodiment of the present disclosure, extension directions of the first connecting lines 210aD and the first connecting lines 210bD may be symmetric about the first central line CL1, whereas angles of the extension directions with respect to the first central line CL1 may be different from each other.

Each of the first connecting lines 210aD may include first portions 210a11 extending in the second direction D2, second portions 210a12 extending in a diagonal direction between the first direction D1 and the second direction D2, and third portions 210a13 extending in an inversely diagonal direction. The second portions 210a12 and the third portions 210a13 may be alternated between a pair of first portions 210a11. The second portion 210a12 and the third portion 210a13 may be substantially symmetric. According to an exemplary embodiment of the present disclosure, angles of respective extension directions of the second portion 210a12 and the third portion 210a13 with respect to the first central line CL1 may be different from each other. The first portion 210a11 may extend linearly. The second portion 210a12 and the third portion 210a13 may extend in a linear shape as illustrated in FIG. 15A or in a zigzag shape as illustrated in FIGS. 10 and 16.

Likewise, each of the first connecting lines 210bD may include first portions 210b11 extending in the second direction D2, second portions 210b12 extending in a diagonal direction between the first direction D1 and the second direction D2, and third portions 210b13 extending in an inversely diagonal direction. The second portions 210b12 and the third portions 210b13 may be alternated between a pair of first portions 210b11. The second portion 210112 and the third portion 210b13 may be substantially symmetric. According to an exemplary embodiment of the present disclosure, angles of respective extension directions of the second portion 210b12 and the third portion 210b13 with respect, to the first central line CL1 may be different from each other. The first portion 210b11 may extend linearly. The second portion 210b12 and the third portion 210b13 may extend in a linear shape as illustrated in FIG. 15B or in a zigzag shape as illustrated in FIGS. 10 and 16.

Referring to FIG. 18, the first connecting lines 210 may include first connecting lines 210a arranged on a left side of the first central line CU and first connecting lines 210bE arranged on a right side of the first central line CU According to an exemplary embodiment of the present disclosure, the first connecting lines 210aE and the first connecting lines 210bE may be substantially symmetric about the first central line CL1. According to an exemplary embodiment of the present disclosure, extension directions of the first connecting lines 210aE and the first connecting lines 210bE may be symmetric about the first central line CL1, whereas angles of the extension directions with respect to the first central line CL1 may be different from each other.

Each of the first connecting lines 210aE may include first portions 210a21 extending in the second direction D2, second portions 210a22 extending in a diagonal direction between the first direction D1 and the second direction D2, third portions 210a23 extending in the first direction D1 and fourth portions 210a24 extending in an inversely diagonal direction. The second portions 210a22, the third portions 210a23, and the fourth portions 210a24 may be alternated between a pair of first portions 210a21. Angles of respective extension directions of the second portion 210a22 and the fourth portion 210a24 with respect to the first central line CL may be the same as each other. According to an exemplary embodiment of the present disclosure, angles of respective extension directions of the second portion 210a22 and the fourth portion 210a24 with respect to the first central line CL1 may be different from each other. The first portion 210a21 and the third portion 210a23 may extend linearly. The second portion 210a22 and the fourth portion 210a24 may extend in a linear shape as illustrated in FIG. 15A or in a zigzag shape as illustrated in FIGS. 10 and 16.

Likewise, each of the first connecting lines 2101E may include first portions 210b21 extending in the second direction D2, second portions 210b22 extending in a diagonal direction between the first direction D1 and the second direction D2, third portions 210b23 extending in the first direction D1, and fourth portions 210b24 extending in an inversely diagonal direction. The second portions 210b22, the third portions 210b23, and the fourth portions 210b24 may alternate between a pair of first portions 210b21. Angles of respective extension directions of the second portion 210b22 and the fourth portion 210b24 with respect to the first central line CL1 may be identical, According to an exemplary embodiment of the present disclosure, angles of respective extension directions of the second portion 210b22 and the fourth portion 210b24 with respect to the first central line CL1 may be different from each other. The first portion 210b21 and the third portion 210b23 may extend linearly. The second portion 210b22 and the fourth portion 210b24 may extend in a linear shape as illustrated FIG. 15B or in a zigzag shape as illustrated in FIGS. 10 and 16.

Figure 19:
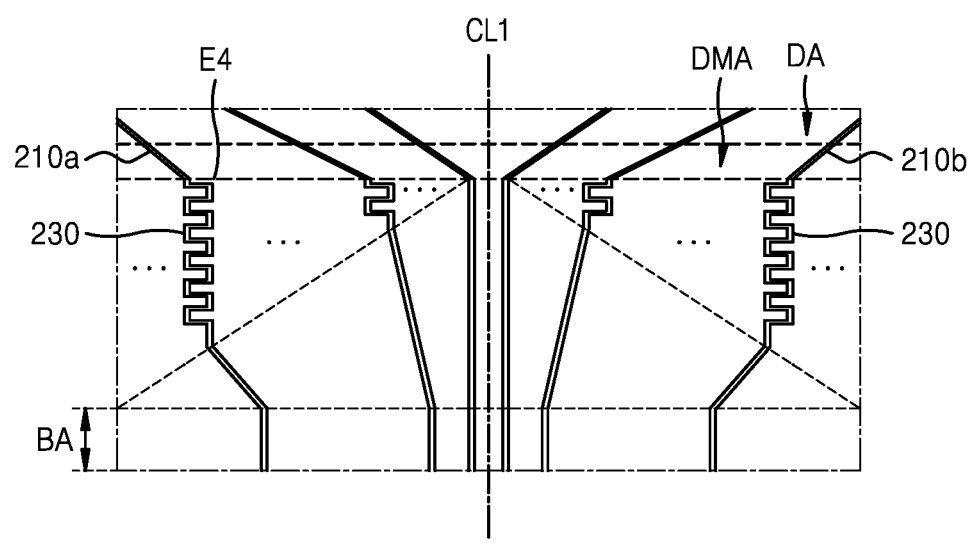
FIG. 19 is a diagram schematically illustrating a second connecting line according to an exemplary embodiment of the present disclosure.

FIG. 19 is a diagram schematically illustrating the second connecting line 230 according to an exemplary embodiment of the present disclosure.

Referring to FIG. 19, the second connecting lines 230 may have a zigzag pattern between the display area DA and the bending area BA, for example, between the dummy area DMA and the bending area BA. As respective lengths of the first connecting lines 210 are different, RC deviation between the first connecting lines 210 may occur. In the embodiment of FIG. 19, the second connecting lines 230 connected to the first connecting lines 210 have a zigzag pattern to reduce length deviation of the first connecting lines 210. The RC deviation between the first connecting lines 210 may be compensated for by increasing the number of zigzag patterns of the second connecting lines 230 in a direction from a center of the first central line CL1 to the edges E1 and E2.

Figure 20:
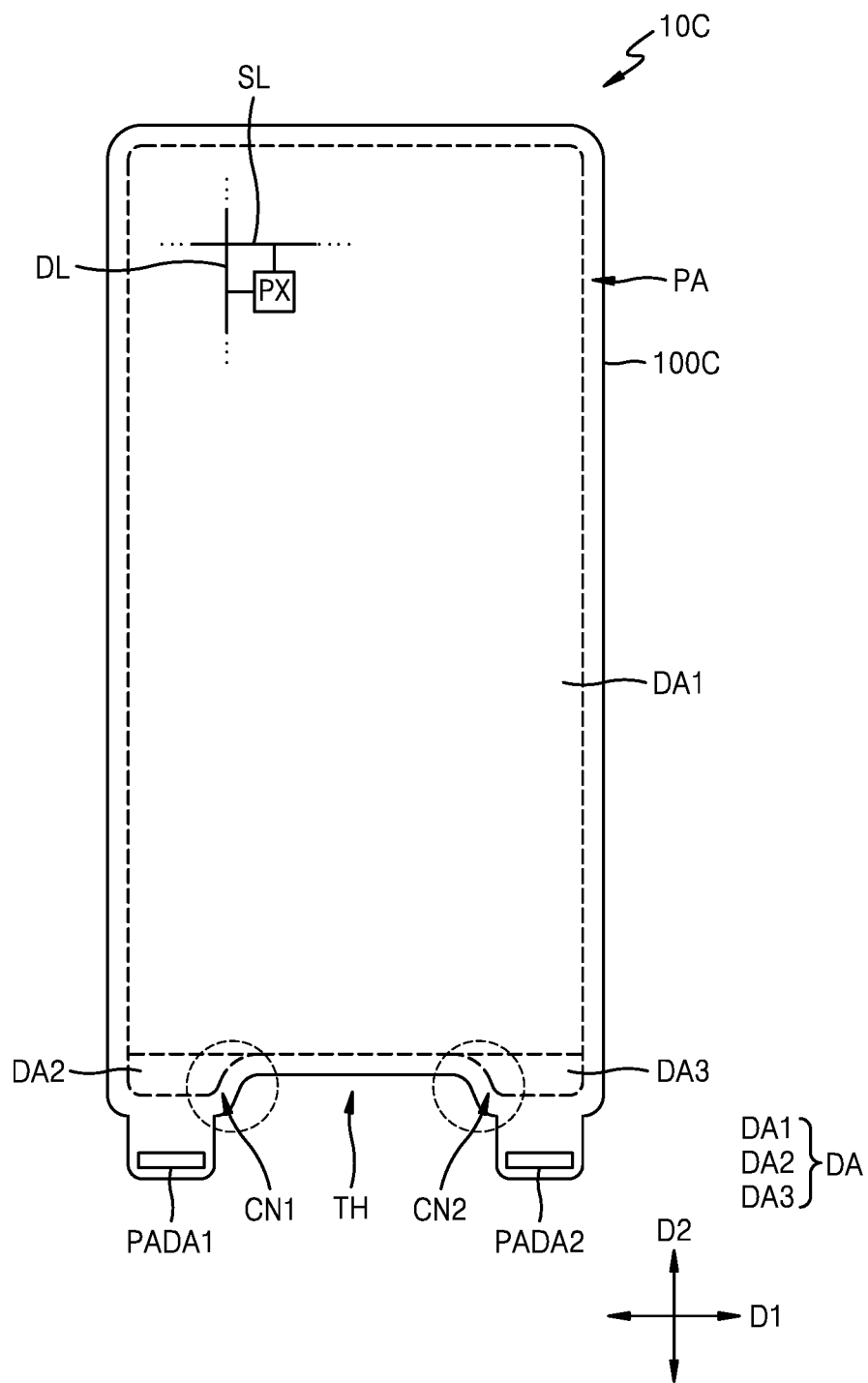
FIG. 20 illustrates an example of a display panel including the first connecting line according to an exemplary embodiment of the present disclosure.
Figure 21:
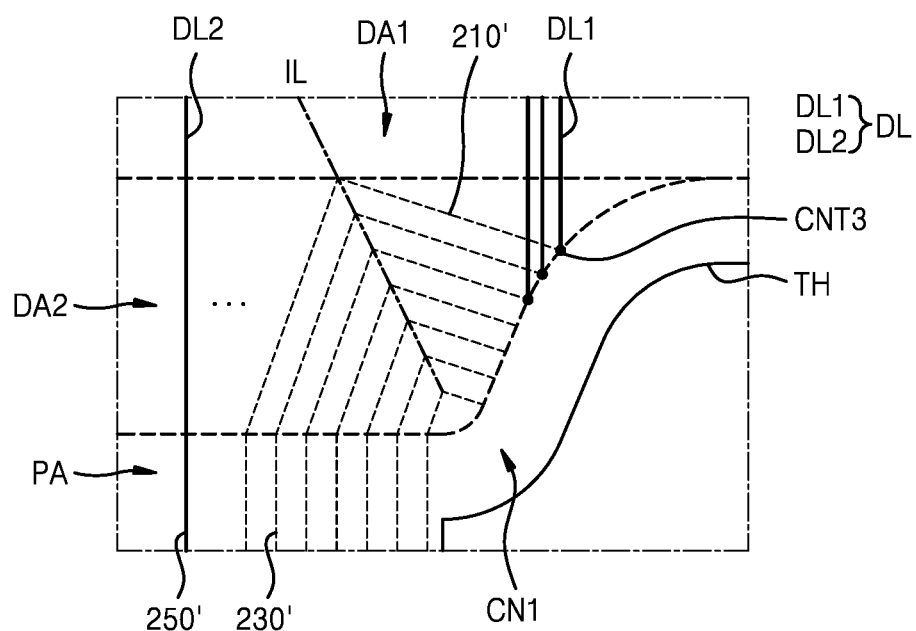
FIG. 21 is a diagram schematically enlarging a portion of FIG. 20.

FIG. 20 illustrates an example of a display panel 10C including a first connecting line according to an exemplary embodiment of the present disclosure. FIG. 21 is a diagram schematically enlarging a portion of FIG. 20.

Referring, to FIG. 20, the display panel 10C has a trench portion TH on a side of the substrate 1000, the trench portion TN dented inwardly. The trench portion may be a through portion, which is a removed area through an upper surface and a lower surface of the substrate 100C. The trench portion TH may be variously modified to have, for example, a shape in which a U-shaped configuration or a configuration of a portion of a polygon is removed. A component such as a camera, a speaker, a sensor, etc. may be arranged in the trench portion TH. The component is described below with reference to FIG. 22.

A display area of the substrate 100C may include a first display area DA1, which is a main display area, and a second display area DA2 and a third display area. DA3 protruding from the first display area DA1 in the second direction D2. The second display area DA2 and the third display area DA3 may be spaced apart from each other by a certain distance in the first direction D1. The peripheral area PA at least partially surrounds the perimeter of the display area DA. The display area DA may include a dummy area in which dummy pixels are arranged, the dummy area at least partially surrounding the edge of the display area DA at a boundary with the peripheral area PA.

The second display area DA2 may have the first corner CN1 having a round shape in proximity to the trench portion TH. The third display, area DA3 may have the second corner CN2 having a round shape in proximity to the trench portion TH. As illustrated in FIG. 21, a first connecting line 210' may be arranged in the second display area DA2 and the third display area. DA3 to reduce the peripheral area PA at the first corner CN1 and the second corner CN2. The first connecting, line 210' may be vertically symmetric about an imaginary straight line IL. According to an exemplary embodiment of the present disclosure, an angle of a direction in which the first connecting line 240' extends to a left side of the imaginary straight line IL with respect to the straight line IL and an angle of a direction in which the first connecting line 210' extends to a right side of the imaginary straight line IL with respect to the straight line IL may be different from each other.

According to an exemplary embodiment of the present disclosure, the first connecting line 210' may extend in a zigzag shape via the pixels PX of a plurality of rows and columns as illustrated in FIGS. 10 and 16. According to an exemplary embodiment of the present disclosure, the first connecting line 210' may have a linear shape across the pixels PX as illustrated in FIGS. 15A and 15B. According to an exemplary embodiment of the present disclosure, the first connecting line 210' may have various shapes in which a linear portion and a zigzag portion are mixed as illustrated in FIGS. 17 and 18.

As illustrated in FIG. 21, one end of the first connecting line 210' may be electrically connected to the first data line DL1 in a third contact portion CN3 of the first corner CN1. The other end of the first connecting line 210' may be connected to a second connecting line 230' in the peripheral area PA. The second connecting line 230' may be a portion where the other end of the first connecting line 210' extends to the peripheral area PA. The second data line DL2 not connected to the first connecting line 210' may be connected to a third connecting line 250' in the peripheral area PA. The third connecting line 250' may be a portion where the second data line DL2 extends to the peripheral area PA.

Figure 22:
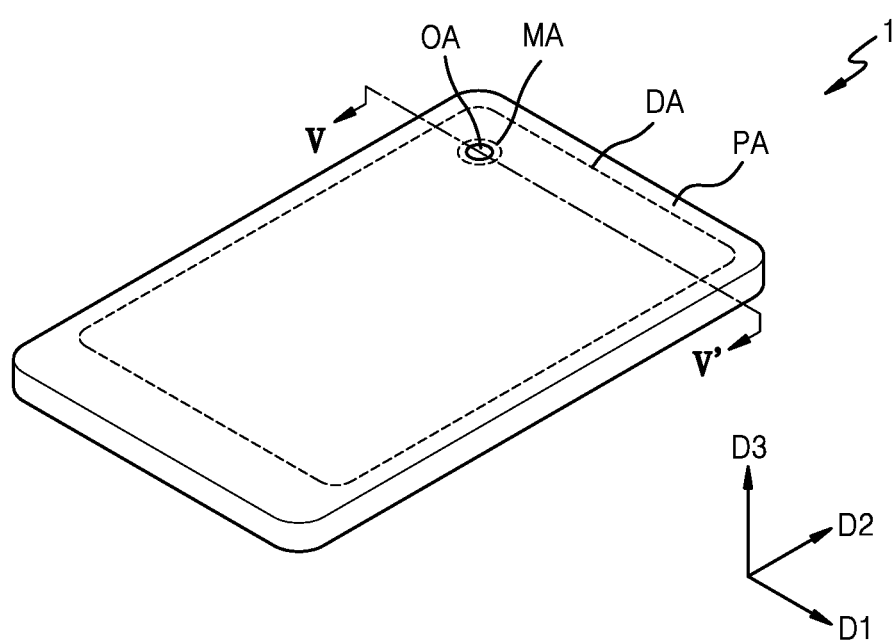
FIG. 22 is a perspective view of a display apparatus including a display panel according to an exemplary embodiment of the present disclosure.
Figure 23A:
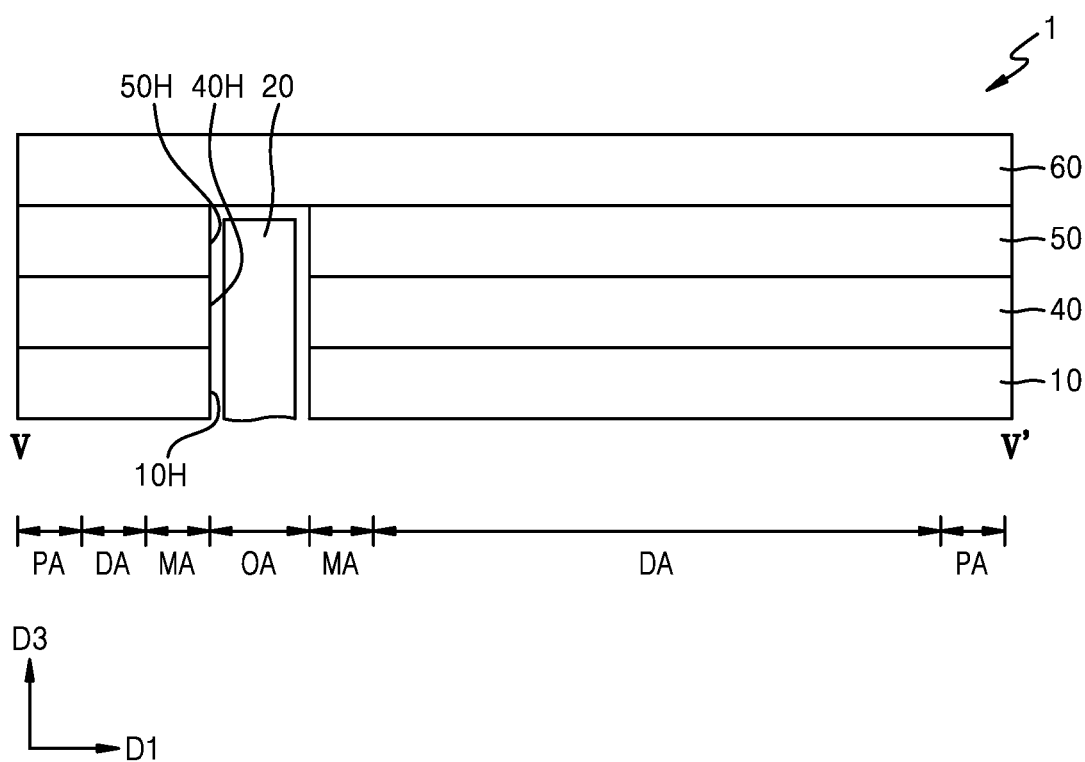
FIGS. 23A and 23B are respective cross-sectional views taken along line V-V' of FIG. 22.
Figure 23B:
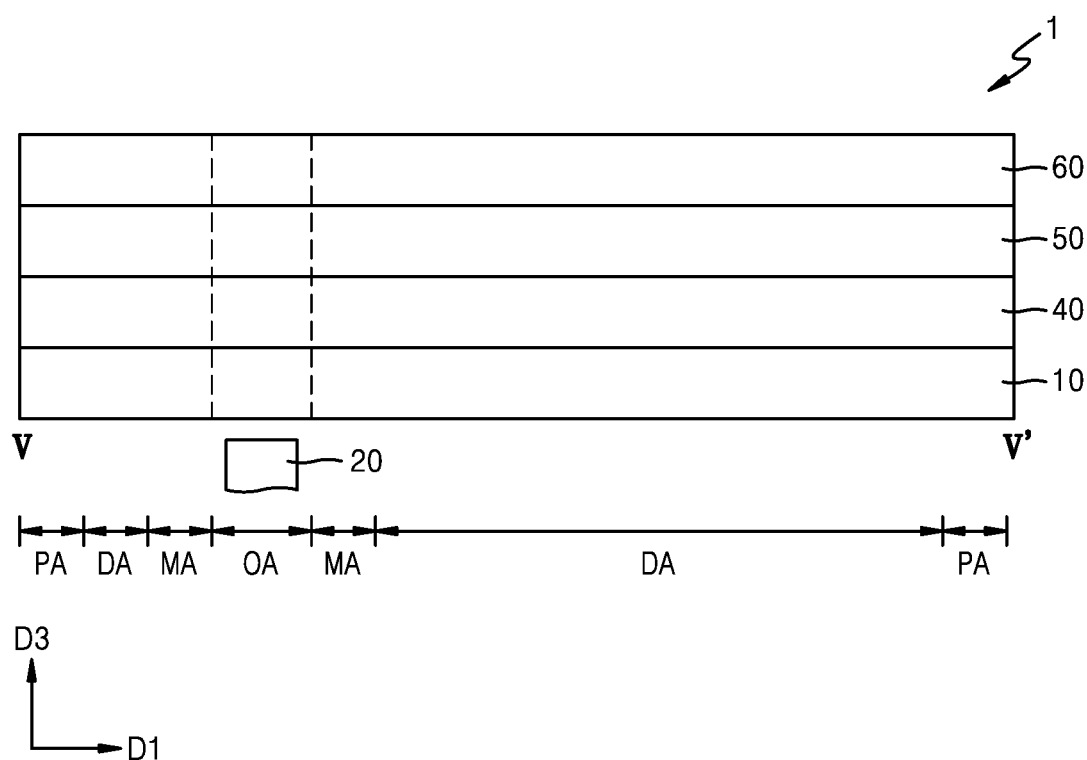

FIG. 22 is a perspective view illustrating a display apparatus 1 including a display panel according to an exemplary embodiment of the present disclosure, and FIGS. 23A and 23B are respective cross-sectional views taken along line V-V of FIG. 22.

Referring to FIG. 22, the display apparatus 1 includes an opening area OA, the display area DA, a middle area MA between the opening area OA and the display area DA, and the peripheral area PA surrounding the display area DA. The display apparatus 1 may provide a certain image by using light emitted from a plurality of pixels arranged in the display area A. FIG. 22 illustrates one opening area OA arranged inside the display area DA, and the opening area OA may be entirely surrounded by the display area DA. The opening area OA may be an area where the component described below with reference to FIGS. 23A and 23B is arranged. According to an exemplary embodiment of the present disclosure, the opening area OA may be a transmission area including a hole through at least one component of the display apparatus 1. According to an exemplary embodiment of the present disclosure, the opening area OA may be a transmission area where at least one component of the display apparatus 1 has no hole.

The middle area MA may be arranged between the opening area OA and the display area DA, and the display area DA may be at least partially surrounded by the peripheral area PA. The middle area MA and the peripheral area PA may be non-display areas having no pixels arranged therein. The middle area MA may be entirely surrounded by the display area. DA, and the display area DA may be entirely surrounded by the peripheral area PA.

The display area DA may include an upper display area being substantially flat and side display areas extending from the upper display area and continuous from the upper display area. The upper display area may include round corners. The side display areas may be display areas extending from at least one side from among four sides of the upper display area. The side display areas may each include an area curved at a certain curvature and an area substantially vertically curved.

Referring to FIG. 23A, the display apparatus 1 may include a display panel 10, an input sensing layer 40 arranged on the display panel 10, and an optical function layer 50, and these components may be covered by a window 60. The display apparatus 1 may represent one of various types of electronic devices such as a mobile phone, a notebook computer, a smartwatch, etc.

The display panel 10 may be the display panel 10A illustrated in FIG. 1 or the display panel 10B illustrated in FIG. 7. The display panel 10 is described below with reference to FIGS. 25A to 25D.

The input sensing layer 40 may be located on the display panel 10. The input sensing layer 40 obtains coordinate information according to an external input, for example, a touch event, which may be a touch by a finger or stylus. The input sensing layer 40 may include a sensing electrode or touch electrode and a trace line connected to the sensing electrode or touch electrode. The input sensing layer 40 may be arranged on the display panel 10. The input sensing layer 40 may sense an external input by using a mutual-capacitance method and/or a self-capacitance method.

The input sensing layer 40 may be directly formed on the display panel 10, or may be separately formed and be combined with the display panel 10 through an adhesive layer such as optical clear adhesive. For example, the input sensing layer 40 may be formed consecutively after a process of forming the display panel 10, and in this case, the input sensing layer 40 may be a portion of the display panel 10, and no adhesive layer might be disposed between the input sensing layer 40 and the display panel 10. FIG. 20A illustrates the input sensing layer 40 disposed between the display panel 10 and the optical function layer 50. However, according to an exemplary embodiment of the present disclosure, the input sensing layer 40 may be arranged on the optical function layer 50.

The optical function layer 50 may include a reflection-preventing layer. The reflection-preventing layer may decrease reflectance of incident light (external light) travelling from the outside toward the display panel 10 through the window 60. The reflection-preventing layer may include a retarder and a polarizer. The retarder may be of a film type or a liquid crystal coating type and may include a half wave plate (λ/2 retarder) and/or a quarter wave plate (λ/4 retarder). The polarizer may also be of a film type or a liquid crystal coating type. The film-type polarizer may include a stretchable synthetic resin film, and the liquid crystal coating-type polarizer may include liquid crystals in a certain arrangement. The retarder and the polarizer may further include a protective film. The protective film of the retarder and the polarizer may be defined as a base layer of the reflection-preventing layer.

According to an exemplary embodiment of the present disclosure, the reflection-preventing layer may include a black matrix and color filters. The color filters may be arranged by taking into account color of light emitted from each pixel of the display panel 10, Each of the color filters may include a red, green, or blue pigment or dye. Alternatively, each of the color filters may further include quantum dots in addition to the above-described pigment or dye. Alternatively, some of the color filters might not include the above-described pigment or dye but scattered particles such as titanium oxide.

According to an exemplary embodiment of the present disclosure, the reflection-preventing layer may include a destructive interference structure. The destructive interference structure may include a first reflective layer and a second reflective layer arranged on different layers from each other. First reflected light and second reflected light respectively reflected from the first reflective layer and the second reflective layer may experience destructive interference, and thus, reflectance of external light may decrease.

The optical function layer 50 may include a lens layer. The lens layer may increase light output efficiency of light emitted from the display panel 10 or may decrease color deviation. The lens layer may include a layer having a concave or convex lens shape and/or may include a plurality of layers having different refractive indexes from each other. The optical function layer 50 may include both of the reflection-preventing layer and the lens layer described above, or may include either of them.

According to an exemplary embodiment of the present disclosure, the optical function layer 50 may be formed consecutively after a process of conning the display panel 10 and/or the input sensing layer 40. In this case, no adhesive layer may be disposed between the optical function layer 50 and the display panel 10 and/or the input sensing layer 40.

The display panel 10, the input sensing layer 40 and/or the optical function layer 50 may include an opening. In this regard, FIG. 23A shows the display panel 10, the input sensing layer 40, and the optical function layer 50 respectively including first to third openings tort 40H, and 50H overlapping one another. The first to third openings 10H, 40H, and 50H may correspond to the opening area OA. According to an exemplary embodiment of the present disclosure, one or more from among the display panel 10, the input sensing layer 40, and the optical function layer 50 may include no opening. For example, one or two components selected among the display panel 10, the input sensing layer 40, and the optical function layer 50 may include no opening. Alternatively, none of the display panel. 10, the input sensing layer 40, and the optical function layer 50 may include an opening as illustrated in FIG. 23B.

As described above, the opening area OA may be a component area for example, a sensor a camera area, a speaker area, which a component 20 for adding various functions to the display apparatus 1 is located. As illustrated in FIG. 23A, the component 20 may be located in the first to third openings 10H, 40H, and 50H. Alternatively, as illustrated in FIG. 23B, the component 20 may be arranged below the display panel 10.

The component 20 may include an electronic element. For example, the component 20 may be an electronic element transmitting and/or receiving light or transmitting and/or receiving sound. For example, the electronic element may include a sensor, such as an infrared sensor, outputting and/or receiving light, a camera receiving light to capture an image, a sensor outputting and sensing light or sound to measure a distance or recognize a fingerprint, a small lamp outputting light, a speaker outputting sound, etc. The electronic element using light may use light in various wavelength ranges, such as visible light, infrared light, Ultraviolet light, etc. According to some exemplary embodiments of the present disclosure, the opening area OA may be a transmission area capable of transmitting light and/or sound output from the component 20 to the outside or travelling from the outside toward the electronic element.

According to an exemplary embodiment of the present disclosure, when the display apparatus 1 is used as a smartwatch or a vehicle-use dashboard, the component 20 may be an element such as clock hands or a needle indicating certain information (for example, a vehicle speed, etc.). When the display apparatus 1 includes clock hands or a vehicle-use dashboard, the component 20 may be externally exposed through the window 60, and the window 60 may include an opening corresponding to the opening area OA.

As described above, the component 20 may include a component (components) related to a function of the display panel 10, or may include a component such as accessories increasing aesthetic sense of the display panel 10. The optical clear adhesive, etc. may be located between the window 60 and the optical function layer 50.

FIGS. 24A to 24D are cross-sectional views schematically illustrating the display panel 10 according to an exemplary embodiment of the present disclosure.

Figure 24A:
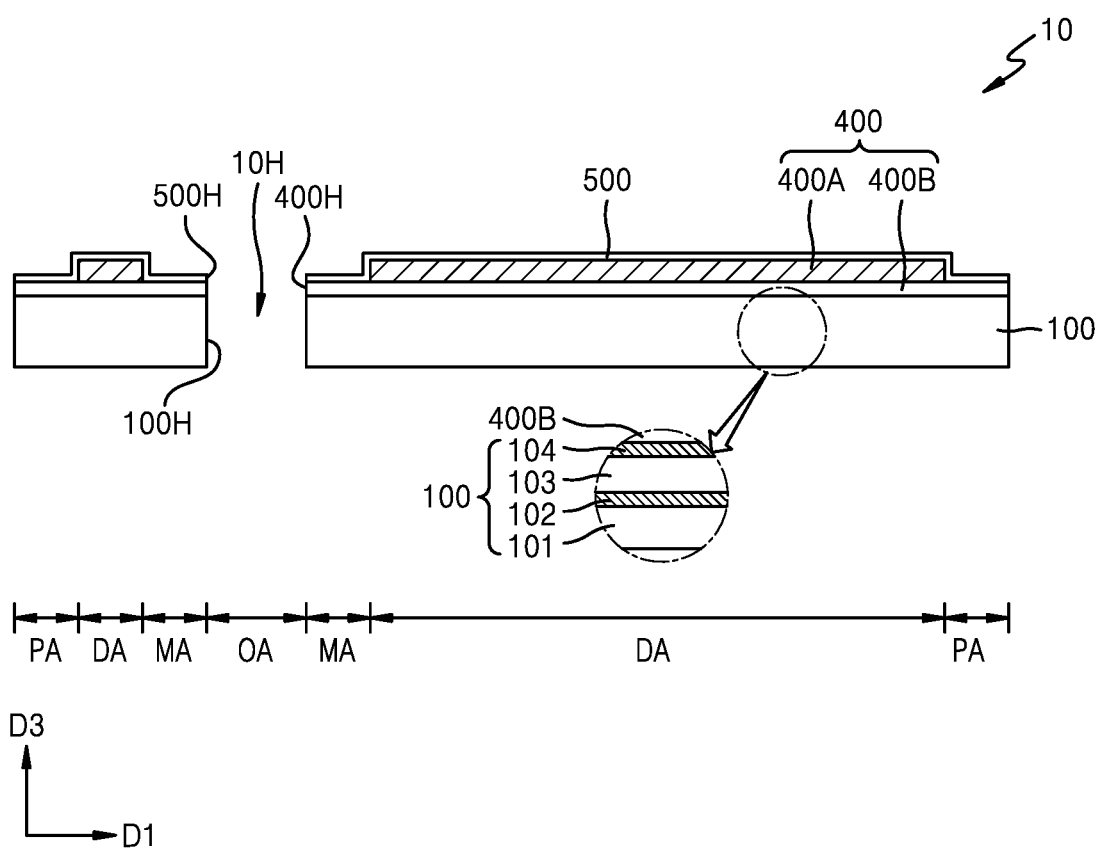
FIGS. 24A to 24D are cross-sectional views schematically illustrating a display panel according to an exemplary embodiment of the present disclosure.

Referring to FIG. 24A, the display panel 10 includes a display layer 400 arranged on a substrate 100. The display layer 400 may include layers between the substrate 100 and a thin film encapsulation layer 500.

The substrate 100 may include glass or polymer resin. The substrate 100 may include various materials having flexible or bendable characteristics. When the substrate 100 includes polymer resin, the substrate 100 may have a multilayer structure. For example, as illustrated in an enlarged view of FIG. 24A, the substrate 100 may include a first base layer 101, a first barrier layer 102, a second base layer 103, and a second harrier layer 104.

The first base layer 101 and the second base layer 103 may each include polymer resin. For example, the first base layer 101 and the second base layer 103 may include polymer resin such as such as polyethersulfone (PES) polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc. The first base layer 101 and the second base layer 103 may include transparent polymer resin.

The first barrier layer 102 and the second barrier layer 104, which are barrier layers preventing permeation of an external foreign material, may have a single-layer or multilayer structure including an inorganic material such as silicon nitride, silicon oxide, etc.

The display layer 400 includes a plurality of pixels. The display layer 400 may include a display element layer 400A including display element s arranged for each pixel and a pixel circuit layer 400B including a pixel circuit arranged for each pixel and insulating layers. Each pixel circuit may include a transistor and a storage capacitor, and each display element may include the organic light-emitting diode OLED.

Display elements of the display layer 400 may be covered by an encapsulation member such as the thin film encapsulation layer 500, and the thin film encapsulation layer 500 may include at least one inorganic encapsulation layer and at least one organic encapsulation layer. When the display panel 10 includes the substrate 100 including polymer resin and the thin film encapsulation layer 500 including an inorganic encapsulation layer and an organic encapsulation layer, flexibility of the display panel 10 may increase.

The display panel 10 may include the first opening 10H through the display panel 10, The first opening 1011 may be located in the opening area OA. FIG. 24A illustrates the substrate 100 and the thin film encapsulation layer 500 respectively including through holes 100H and 500H corresponding to the first opening ION of the display panel 10. The display layer 400 may also include a through hole 40011 corresponding to the opening area OA.

Figure 24B:
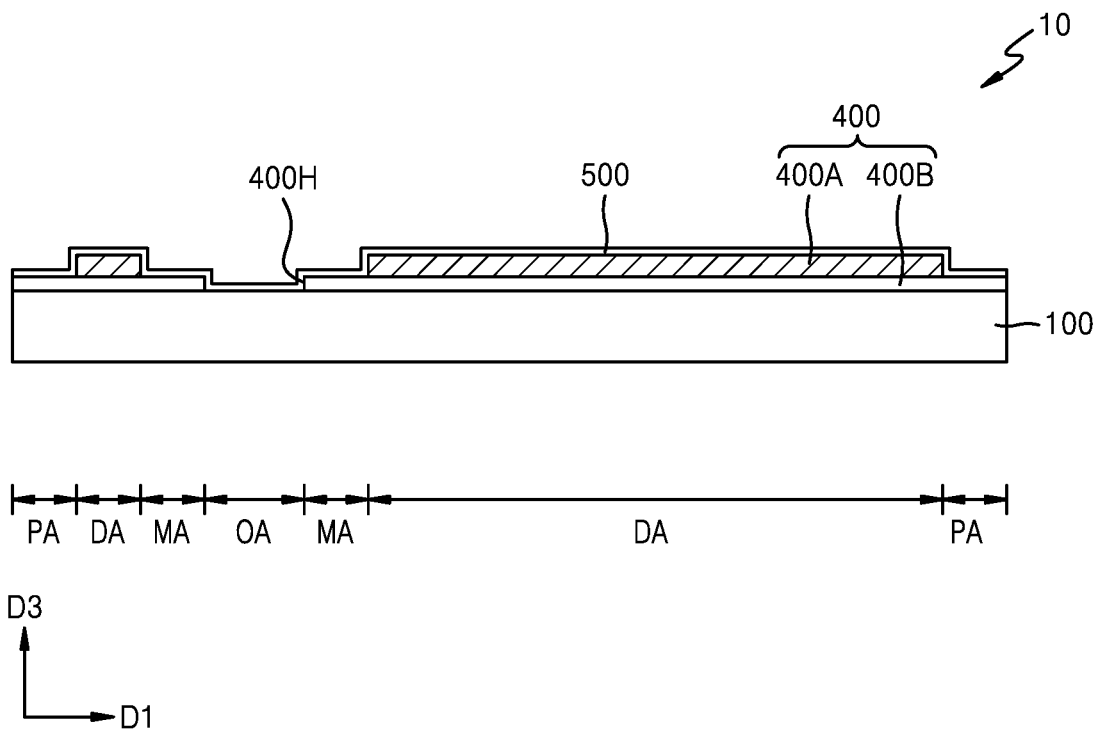

According to an exemplary embodiment of the present disclosure, as illustrated in FIG. 24B, the substrate 100 might not include a through hole corresponding to the opening area OA. The display layer 400 may include the through hole 4001 corresponding to the opening area OA. The thin film encapsulation layer 500 might not include a through hole corresponding to the opening area OA. According to an exemplary embodiment of the present disclosure, as illustrated in FIG. 24C, the display layer 400 might not include the through hole 400:11 corresponding to the opening area OA, and the display element layer 400A is not located in the opening area OA.

Figure 24C:
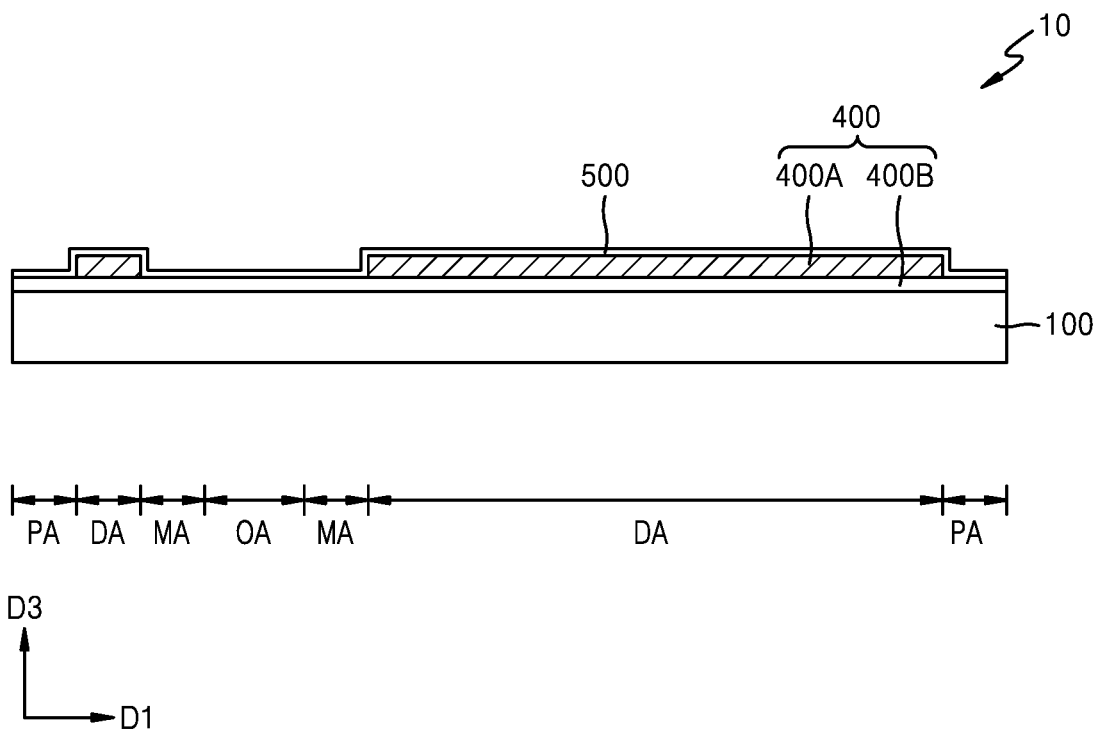
Figure 24D:
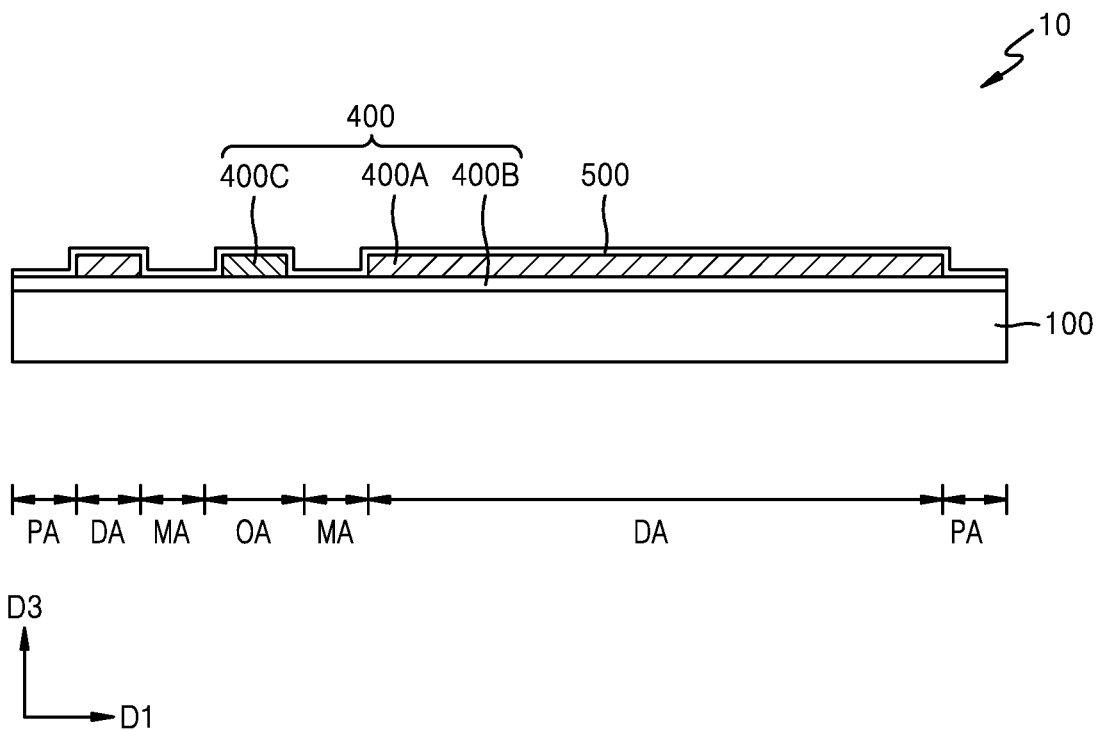

Although FIGS. 24A to 24C illustrate the display element layer 400A not located in the opening area OA, the present invention is not limited thereto. According to an exemplary embodiment of the present disclosure, as illustrated in FIG. 241), an auxiliary display element layer 400C may be located in the opening area OA. The auxiliary display element layer 400C may include display elements operating in a different structure and/or a different manner from the display elements of the display element layer 400A.

According to an exemplary embodiment of the present disclosure, each pixel of the display element layer 400A may include an active organic light-emitting diode, and the auxiliary display element layer 400C may include pixels each including a passive organic light-emitting diode. When the auxiliary display element layer 400C includes a display element of the passive organic light-emitting diode, elements of the pixel circuit might not be present under the corresponding passive organic light-emitting diode. For example, a portion of the pixel circuit layer 400B under the auxiliary display element layer 400C may include neither of the transistor and the storage capacitor.

According to an exemplary embodiment of the present disclosure, the auxiliary display element layer 400C may include a display element of the same type as the display element layer 400A (for example, an active organic light-emitting diode), whereas a structure of the pixel circuit below may be different from each other. For example, a pixel circuit under the auxiliary display element layer 400C (for example, a pixel circuit having a lightproof film between a substrate and a transistor) may include a different structure from a pixel circuit under the display element layer 400A. Alternatively, display elements of the auxiliary display element layer 400C may operate according to a different control signal from the display elements of the display element layer 400A. A component that does not require a relatively high transmittance (for example, an infrared sensor) may be arranged in the opening area OA in which the auxiliary element device layer 400C is arranged. In this case, the opening area OA may be a component area and an auxiliary display area.

FIGS. 25A to 25D are cross-sectional views schematically illustrating a display panel 10' according to an exemplary embodiment of the present disclosure. While the display panel 10 described above with reference to FIGS. 24A to 24D includes the thin film encapsulation layer 500, the display panel 10' of FIGS. 25A to 25D may include a sealant 540 of an encapsulation substrate 500A.

Figure 25A:
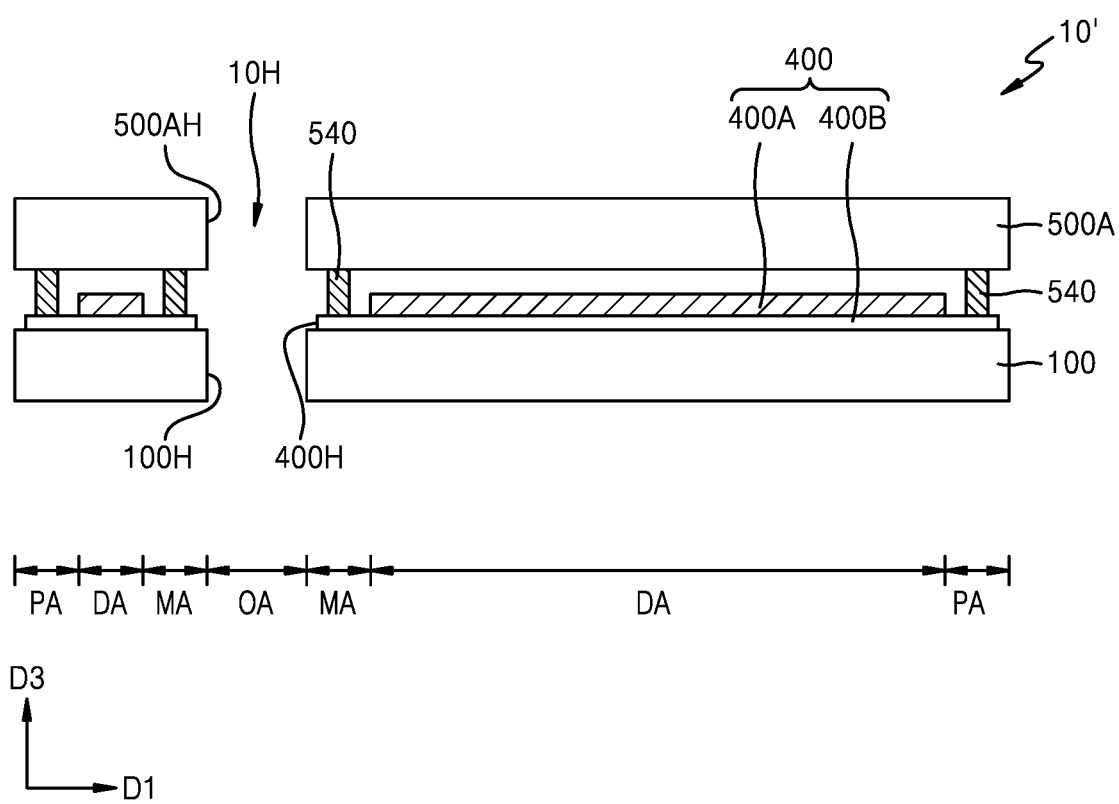
FIGS. 25A to 25D are cross-sectional views schematically illustrating a display panel according to an exemplary embodiment of the present disclosure.
Figure 25B:
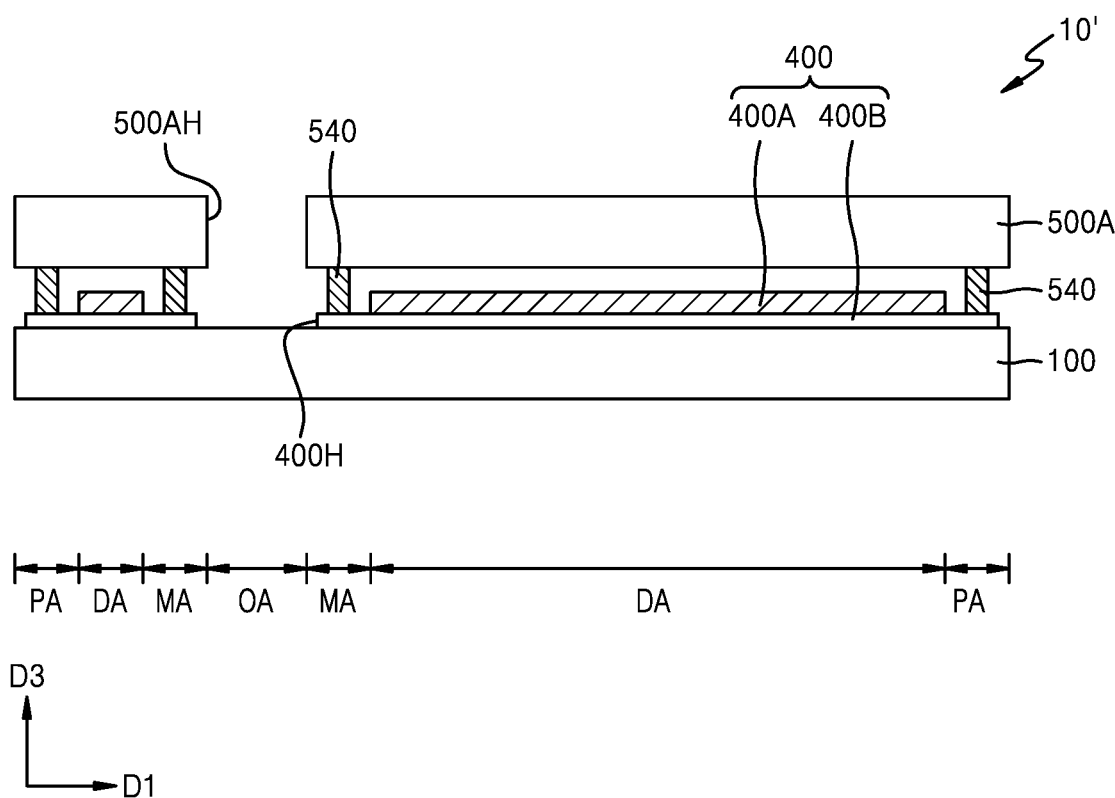
Figure 25C:
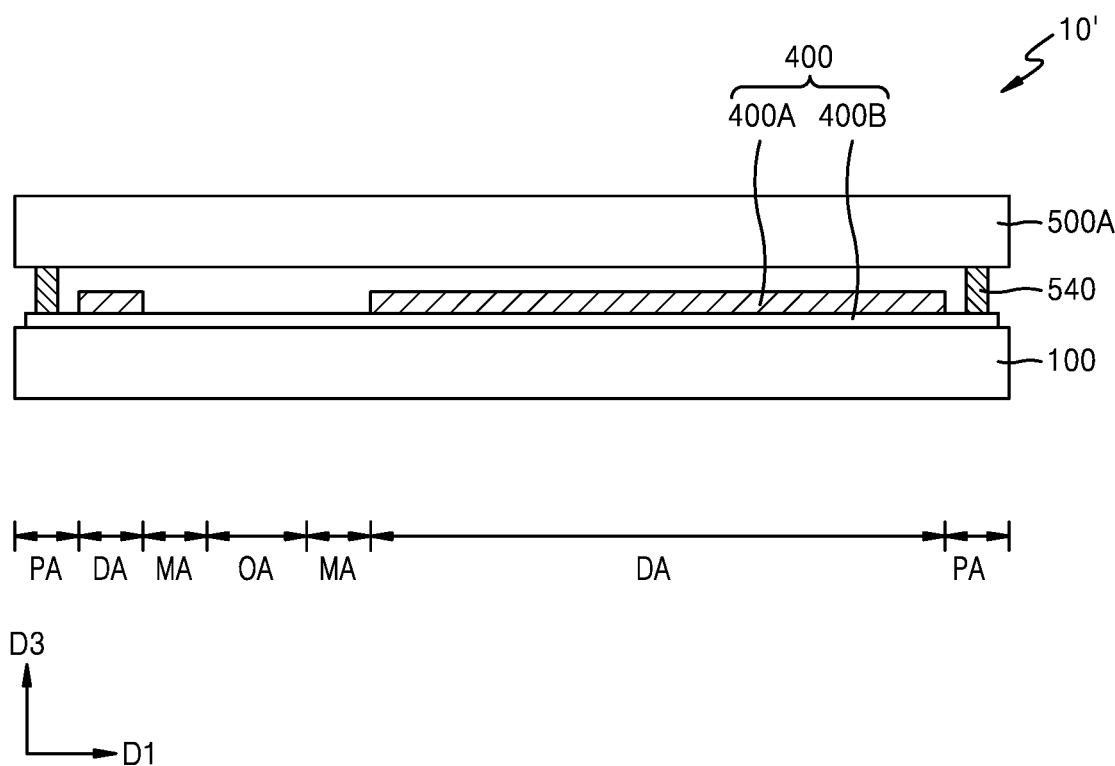
Figure 25D:
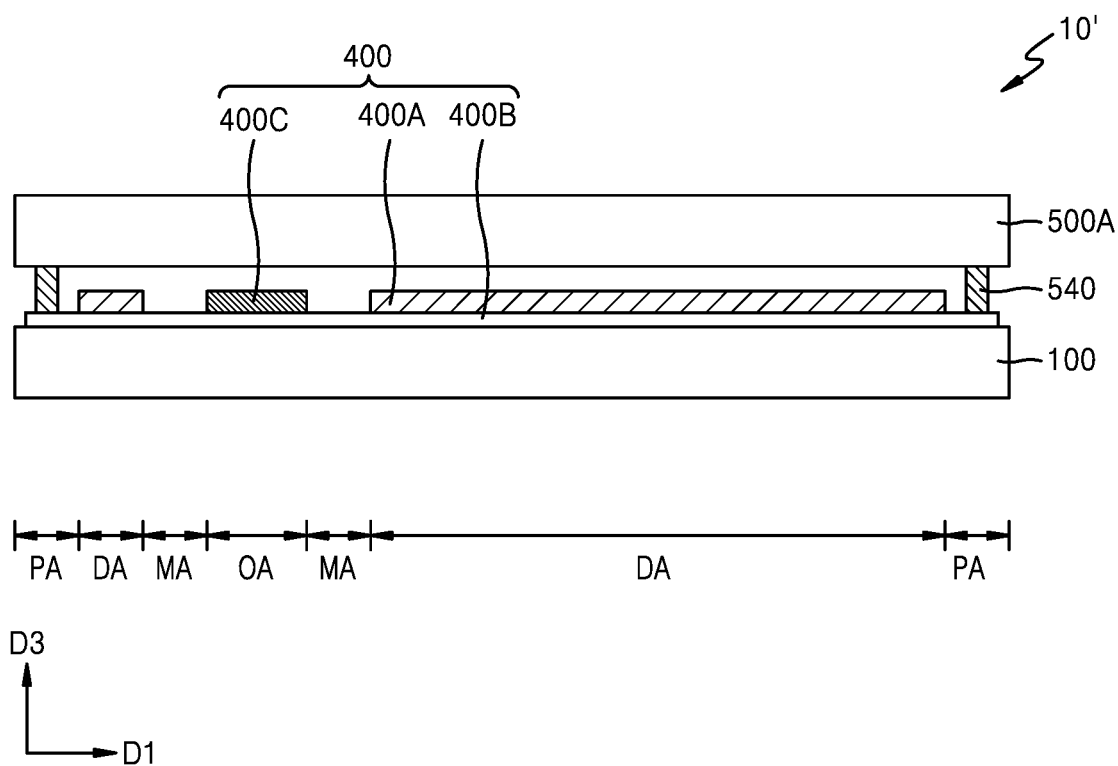

As illustrated in FIGS. 25A to 250, one or more from among the substrate 100, the display layer 400, and the encapsulation substrate 500A may include through holes 100H, 400H, and 500AH corresponding to the opening area OA. In the opening, area OA, the display element layer 400A might not, be arranged or the auxiliary display element layer 400C may be arranged as illustrated in FIG. 25D. The auxiliary display element layer 400C is the same as described above with reference to FIG. 241.

The first connecting lines 210 according to one or more embodiments may have various shapes preventing diagonal spots due to coupling capacitance (parasitic capacitance) with the scan line St, from being visible and reducing wire RC. The first connecting lines 210 may have various shapes in which a portion extending in the first direction D1, a portion extending in the second direction D2, and a portion extending in the diagonal direction are mixed. A portion of the first connecting lines 210 extending in the diagonal direction may have a zigzag shape (FIG. 10, FIG. 16) having a first sub-portion and a second sub-portion repeated or a linear shape (FIG. 15A, FIG. 15B).

According to one or more exemplary embodiments of the present disclosure, the first connecting line 210 may extend such that a first sub-portion is n times as long as the first length and a second sub-portion is n times as long as the second length. In this regard, n is an integer equal to or greater than 1 (e.g. a positive integer). According to an exemplary embodiment of the present disclosure, in the first connecting line 210, a first sub-portion may have the first length and a second sub-portion may have the second length. According to an exemplary embodiment of the present disclosure, in the first connecting line 210, a first sub-portion may be twice or more as long as the first length and a second sub-portion may be twice or more as long as the second length. According to an exemplary embodiment of the present disclosure, some of first sub-portions of the first connecting line 210 may have the first length, and the others may be twice or more as long as the first length. In addition, some of second sub-portions of the first connecting line 210 may have the second length, and the others may be twice or more as long as the second length.

According to one or more exemplary embodiments of the present disclosure, first sub-portions of an adjacent pair of first connecting lines 210 may be spaced apart from each other by n times of the second length. Second sub-portions of the adjacent pair of first connecting lines 210 may be spaced apart from each other by n times of the first length.

A structure of the first connecting line 210, according to one or exemplary more embodiments of the present disclosure, is not limited to the above-described display apparatus and may be applied to a display apparatus, such as a smartwatch or a vehicle-use dashboard, in which the edge of a display area has at least one round corner.

According to one or more exemplary embodiments of the present disclosure, a display apparatus in which a dead space of the display apparatus may decrease due to connecting lines of a display area and thus a data signal may be stably transmitted to a pixel without a rise in manufacturing cost may be provided. However, one or more embodiments described herein are not limited by such an effect.

It should be understood that exemplary embodiments of the present disclosure described herein should be considered in a descriptive. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display apparatus comprising:
   a substrate comprising a display area and a peripheral area at least partially surrounding the display area, wherein the peripheral area comprises a pad area;
   a data line disposed in the display area; and
   a first connecting line disposed in the display area and connected to the data line, the first connecting line transmitting a signal from a pad of the pad area to the data line,
   wherein the display area comprises a dummy area adjacent to a boundary between the display area and the peripheral area,
   wherein the first connecting line comprises a first portion disposed within the display area, extending from an edge of the display area adjacent to the pad area in a direction away from the peripheral area, and a second portion disposed within the display area and bent with respect to the first portion and extending towards a corner of the edge of the display area,
   wherein the second portion is connected to the data line in the dummy area.

2. The display apparatus of claim 1,
   wherein, in the first connecting line, the first portion and the second portion extend in a direction inclined with respect to a first direction in which the data line extends.

3. The display apparatus of claim 2,
   wherein the first portion and the second portion of the first connecting line extend in a zigzag shape.

4. The display apparatus of claim 2,
   wherein the first portion and the second portion of the first connecting line extend linearly.

5. The display apparatus of claim 1,
   wherein the data line and the first connecting line are on different layers from each other.

6. A display apparatus comprising:
   a substrate comprising a display area and a peripheral area at least partially surrounding the display area, wherein the peripheral area comprises a pad area;
   a data line disposed in the display area; and
   a first connecting line disposed in the display area and connected to the data line, the first connecting line transmitting a signal from the pad area to the data line,
   wherein the display area comprises a dummy area adjacent to a boundary between the display area and the peripheral area,
   wherein the first connecting line comprises a first portion, extending from an edge of the display area in a direction away from the peripheral area, and a second portion bent with respect to the first portion and extending towards a corner of the edge of the display area,
   wherein the second portion is connected to the data line in the dummy area, and
   wherein the first connecting, line further comprises a third portion extending in a first direction in which the data line extends and/or a fourth portion extending in a second direction perpendicular to the first direction.

7. The display apparatus of claim 1,
   further comprising a second connecting line disposed in the peripheral area and comprising a first end connected to the first portion of the first connecting line and a second end disposed in the pad area.

8. A display apparatus comprising:
   a substrate comprising a display area and a peripheral area at least partially surrounding the display area, wherein the peripheral area comprises a pad area;
   a plurality of scan lines disposed in the display area and each scan line of the plurality of scan lines extending in a first direction;
   a plurality of first data lines disposed in the display area and each first data line of the plurality of first data lines extending in a second direction perpendicular to the first direction; and
   a plurality of first connecting lines disposed in the display area and connected to the plurality of first data lines to transmit a signal from pads of the pad area to the plurality of first data lines,
   wherein each of the plurality of first connecting lines comprises a first portion disposed in the display area, extending from an edge of the display area adjacent to the pad area in a direction away from the peripheral area, and a second portion disposed in the display area and bent from the first portion and extending towards a corner of the edge of the display area,
   wherein each of the first portion and the second portion alternates between a first sub-portion extending parallel to at least one of the plurality of scan lines and a second sub-portion extending parallel to at least one of the plurality of first data lines.

9. The display apparatus of claim 8,
   wherein, in each of the plurality of first connecting lines, the first portion and the second portion extend in a direction inclined with respect to the first direction while alternating between the first sub-portion and the second sub-portion.

10. The display apparatus of claim 8,
    wherein the plurality of first connecting lines are on a different layer from the plurality of scan lines.

11. The display apparatus of claim 10,
    wherein the first sub-portion at least partially overlaps the at least one scan line.

12. The display apparatus of claim 8,
wherein the plurality of first connecting lines are on a different layer from the plurality of first data lines.

13. The display apparatus of claim 12,
wherein the second sub-portion at least partially overlaps the at least one first data line.

14. The display apparatus of claim 8,
wherein the first sub-portion has a length that is n times (where n is a positive integer) as much as a first length corresponding to a distance between two adjacent first data lines, and the second sub-portion has a length that is m times (where in is a positive integer) as much as a second length corresponding to a distance between two adjacent scan lines.

15. The display apparatus of claim 8,
wherein the first sub-portions of adjacent first connecting lines are spaced apart from each other by a length that is n times (where n is a positive integer) as much as a second length corresponding to a distance between two adjacent scan lines, and
the second sub-portions of the adjacent first connecting lines are spaced apart from each other by a length that is m times (where m is a positive integer) as much as a first length corresponding to a distance between two adjacent first data lines.

16. The display apparatus of claim 8,
wherein each of the plurality of first connecting lines further comprises a third portion connected to the first portion and extending linearly in the first direction and a fourth portion connected to the second portion and extending linearly in the first direction.

17. The display apparatus of claim 16,
wherein each of the plurality of first connecting lines further comprises a fifth portion disposed between the first portion and the second portion and extending linearly in the first direction.

18. The display apparatus of claim 8,
wherein the display area comprises a dummy area adjacent to a boundary between the display area and the peripheral area,
wherein the second portion is connected to one of the plurality of first data lines in the dummy area disposed at the corner of the edge of the display area.

19. The display apparatus of claim 8,
further comprising a second connecting line disposed in the peripheral area and comprising a first end connected to the first portion of each of the plurality of first connecting lines and a second end disposed in the pad area.

20. The display apparatus of claim 8,
further comprising:
a plurality of second data lines disposed in the display area and each extending in the second direction; and
a third connecting line disposed in the peripheral area and comprising a first end connected to one of the plurality of second data lines and a second end disposed in the pad area.

\* \* \* \* \*